(12) United States Patent
Wang et al.

(10) Patent No.: US 10,269,649 B2
(45) Date of Patent: Apr. 23, 2019

(54) WRAP-AROUND CONTACT ON FINFET

(71) Applicant: Taiwan Semiconductor Manufacturing Company, Ltd., Hsinchu (TW)

(72) Inventors: Sung-Li Wang, Zhubei (TW); Neng-Kuo Chen, Hsinchu (TW); Ding-Kang Shih, New Taipei (TW); Meng-Chun Chang, Taipei (TW); Yi-An Lin, Taipei (TW); Gin-Chen Huang, New Taipei (TW); Chen-Feng Hsu, Hsinchu (TW); Hau-Yu Lin, Kaohsiung (TW); Chih-Hsin Ko, Fongshan (TW); Sey-Ping Sun, Hsinchu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/938,225

(22) Filed: Mar. 28, 2018

(65) Prior Publication Data

US 2018/0219077 A1    Aug. 2, 2018

Related U.S. Application Data

(60) Continuation of application No. 15/226,557, filed on Aug. 2, 2016, now Pat. No. 9,941,367, which is a
(Continued)

(51) Int. Cl.
*H01L 29/00* (2006.01)
*H01L 21/8234* (2006.01)
(Continued)

(52) U.S. Cl.
CPC ........... *H01L 21/823431* (2013.01); *H01L 21/823418* (2013.01); *H01L 21/823468* (2013.01);
(Continued)

(58) Field of Classification Search
CPC .................................................... H01L 29/7853
See application file for complete search history.

(56) References Cited

U.S. PATENT DOCUMENTS

| 5,552,346 A | 9/1996 | Huang et al. |
| 7,183,152 B1 | 2/2007 | Dakshina-Murthy et al. |

(Continued)

OTHER PUBLICATIONS

Zaima, et al., Study of reaction and electrical properties at Ti/SiGe/Si(100) contacts for ultralarge scale integrated applications, Journal of Vacuum Science & Technology, vol. 16 No. 5, Sep./Oct. 1998, pp. 2623-2628.

*Primary Examiner* — Mounir S Amer
*Assistant Examiner* — Alexander Belousov
(74) *Attorney, Agent, or Firm* — Slater Matsil, LLP

(57) ABSTRACT

A fin structure is on a substrate. The fin structure includes an epitaxial region having an upper surface and an under-surface. A contact structure on the epitaxial region includes an upper contact portion and a lower contact portion. The upper contact portion includes a metal layer over the upper surface and a barrier layer over the metal layer. The lower contact portion includes a metal-insulator-semiconductor (MIS) contact along the under-surface. The MIS contact includes a dielectric layer on the under-surface and the barrier layer on the dielectric layer.

20 Claims, 28 Drawing Sheets

Related U.S. Application Data division of application No. 14/257,809, filed on Apr. 21, 2014, now Pat. No. 9,443,769.

(51) Int. Cl.

| | |
|---|---|
| *H01L 29/78* | (2006.01) |
| *H01L 29/66* | (2006.01) |
| *H01L 21/8238* | (2006.01) |
| *H01L 29/165* | (2006.01) |
| *H01L 29/161* | (2006.01) |
| *H01L 29/16* | (2006.01) |
| *H01L 29/06* | (2006.01) |
| *H01L 29/417* | (2006.01) |
| *H01L 27/088* | (2006.01) |
| *H01L 29/423* | (2006.01) |
| *H01L 29/51* | (2006.01) |

(52) U.S. Cl.
CPC ........ *H01L 21/823475* (2013.01); *H01L 21/823481* (2013.01); *H01L 21/823814* (2013.01); *H01L 27/0886* (2013.01); *H01L 29/0649* (2013.01); *H01L 29/0653* (2013.01); *H01L 29/161* (2013.01); *H01L 29/165* (2013.01); *H01L 29/1608* (2013.01); *H01L 29/41783* (2013.01); *H01L 29/41791* (2013.01); *H01L 29/42364* (2013.01); *H01L 29/518* (2013.01); *H01L 29/665* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/785* (2013.01); *H01L 29/7842* (2013.01); *H01L 29/7848* (2013.01); *H01L 29/7851* (2013.01); *H01L 29/7853* (2013.01); *H01L 29/7854* (2013.01); *H01L 2029/7858* (2013.01)

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Ku et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2004/0036126 A1 | 2/2004 | Chau et al. | |
| 2004/0217420 A1 | 11/2004 | Yeo et al. | |
| 2005/0285186 A1 | 12/2005 | Fujiwara | |
| 2009/0095980 A1 | 4/2009 | Yu et al. | |
| 2009/0280641 A1* | 11/2009 | Kang | H01L 29/0653 438/400 |
| 2011/0147840 A1 | 6/2011 | Cea et al. | |
| 2011/0193175 A1 | 8/2011 | Huang et al. | |
| 2011/0210404 A1 | 9/2011 | Su et al. | |
| 2012/0211807 A1 | 8/2012 | Yu et al. | |
| 2012/0280250 A1 | 11/2012 | Basker et al. | |
| 2012/0319211 A1 | 12/2012 | van Dal et al. | |
| 2013/0049068 A1 | 2/2013 | Lin et al. | |
| 2013/0071980 A1 | 3/2013 | Lin et al. | |
| 2013/0099282 A1 | 4/2013 | Chen et al. | |
| 2013/0161756 A1 | 6/2013 | Glass et al. | |
| 2013/0175659 A1 | 7/2013 | Liu | |
| 2013/0200455 A1 | 8/2013 | Lo et al. | |
| 2013/0228875 A1 | 9/2013 | Lee et al. | |
| 2013/0234147 A1 | 9/2013 | Wu et al. | |
| 2013/0249003 A1 | 9/2013 | Oh et al. | |
| 2013/0334606 A1 | 12/2013 | Shen et al. | |
| 2014/0001574 A1 | 1/2014 | Chen et al. | |
| 2014/0065782 A1 | 3/2014 | Lu et al. | |
| 2014/0110755 A1 | 4/2014 | Colinge | |
| 2014/0151812 A1 | 6/2014 | Liaw | |
| 2014/0197456 A1 | 7/2014 | Wang et al. | |
| 2014/0197457 A1 | 7/2014 | Wang et al. | |
| 2014/0203370 A1 | 7/2014 | Maeda et al. | |
| 2014/0217517 A1* | 8/2014 | Cai | H01L 29/0653 438/400 |
| 2014/0248761 A1 | 9/2014 | Park et al. | |
| 2014/0273397 A1 | 9/2014 | Rodder et al. | |
| 2014/0273429 A1 | 9/2014 | Wei et al. | |
| 2014/0299934 A1 | 10/2014 | Kim et al. | |
| 2014/0374827 A1 | 12/2014 | Suh et al. | |
| 2014/0377922 A1 | 12/2014 | Fung | |
| 2015/0035046 A1 | 2/2015 | Kim et al. | |
| 2015/0091086 A1 | 4/2015 | Lu et al. | |
| 2015/0105844 A1 | 4/2015 | Tass et al. | |
| 2015/0187571 A1 | 7/2015 | Fan et al. | |
| 2015/0187943 A1 | 7/2015 | Lee et al. | |
| 2015/0200271 A1 | 7/2015 | Lee et al. | |
| 2015/0214051 A1 | 7/2015 | Kim et al. | |
| 2015/0214059 A1 | 7/2015 | Bouche et al. | |
| 2015/0255576 A1 | 9/2015 | Liao et al. | |
| 2015/0295087 A1 | 10/2015 | Cheng et al. | |
| 2015/0303118 A1 | 10/2015 | Wang et al. | |

\* cited by examiner

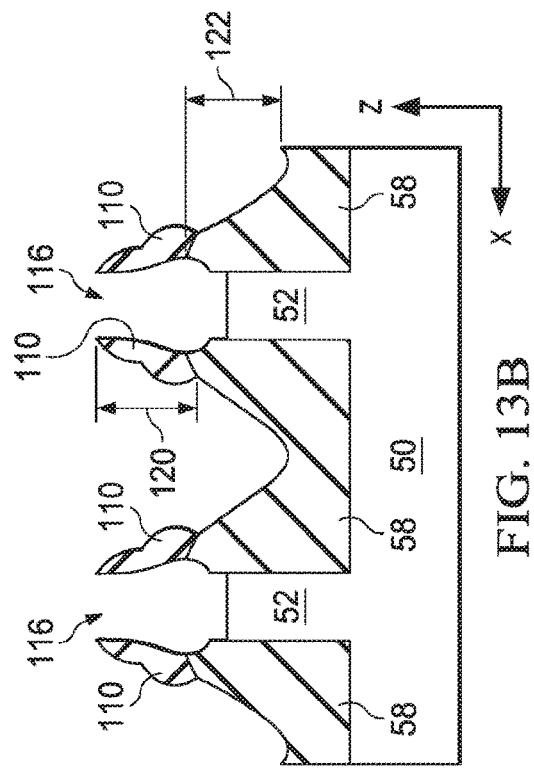
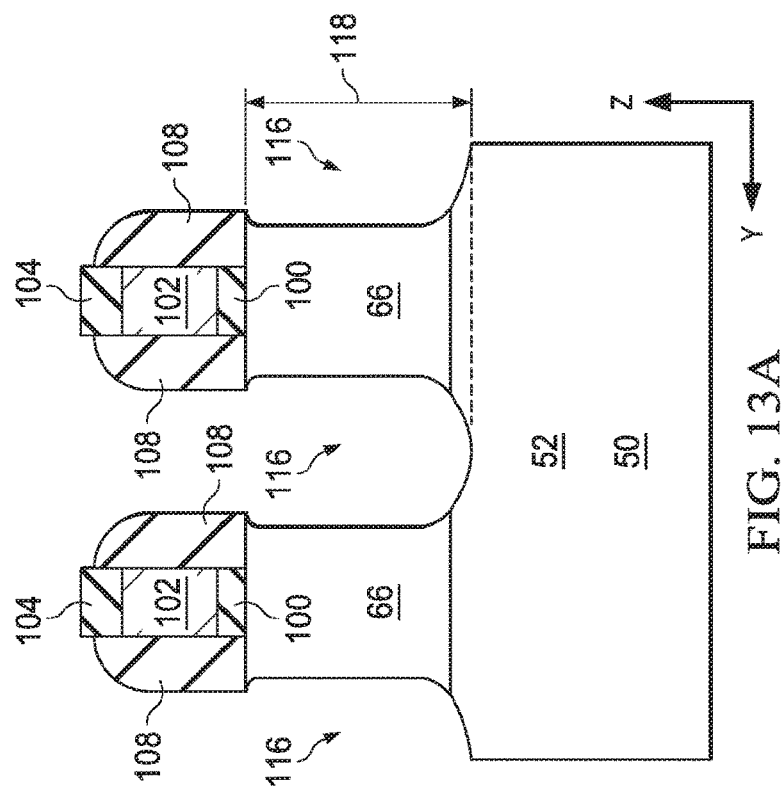
FIG. 13A
FIG. 13B

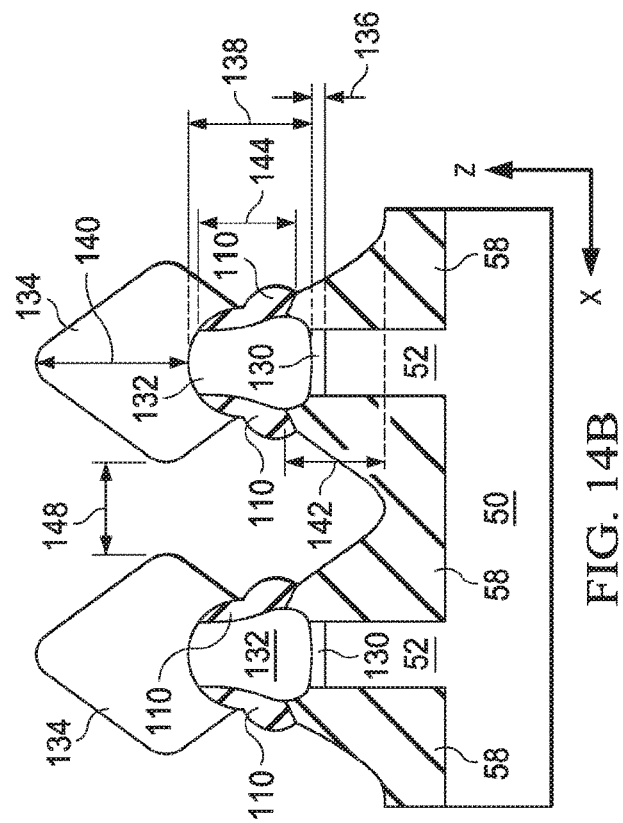
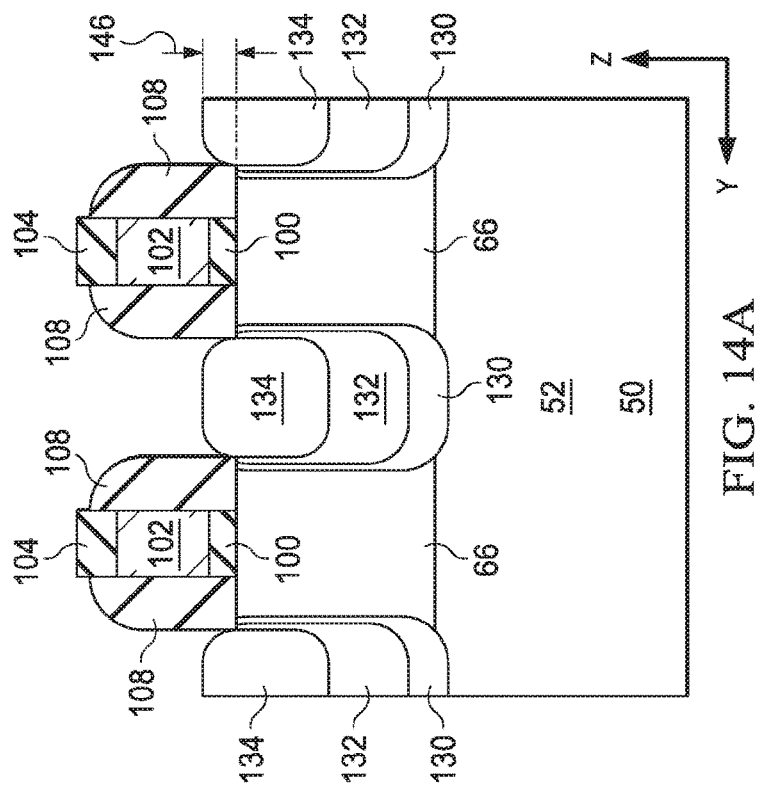
FIG. 14B
FIG. 14A

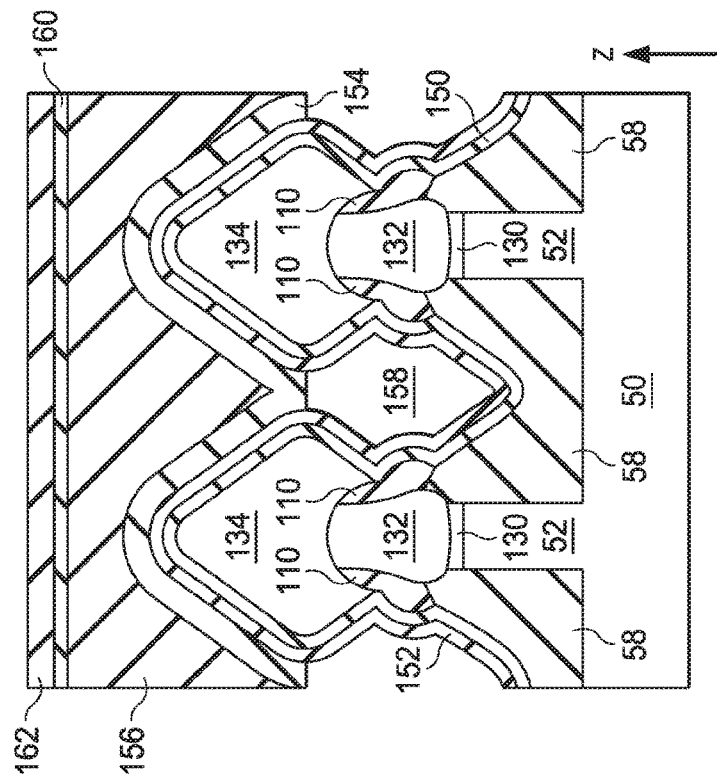
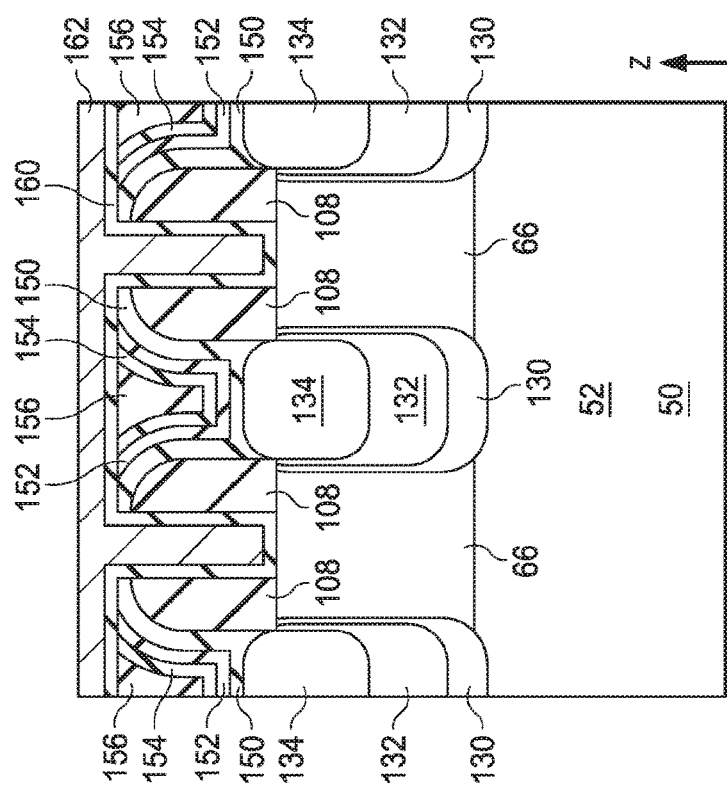
FIG. 18A
FIG. 18B

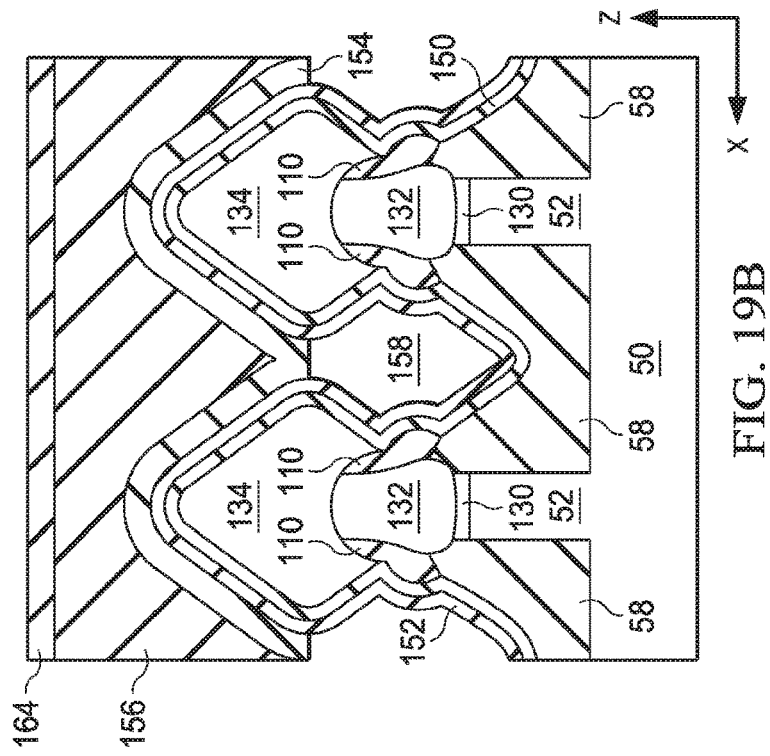
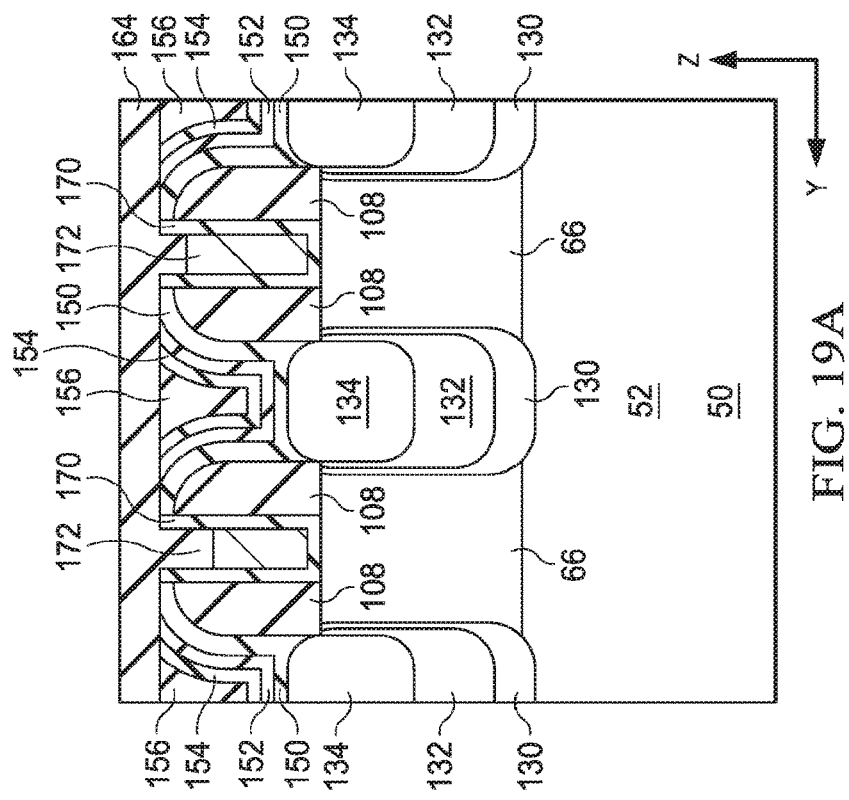
FIG. 19B
FIG. 19A

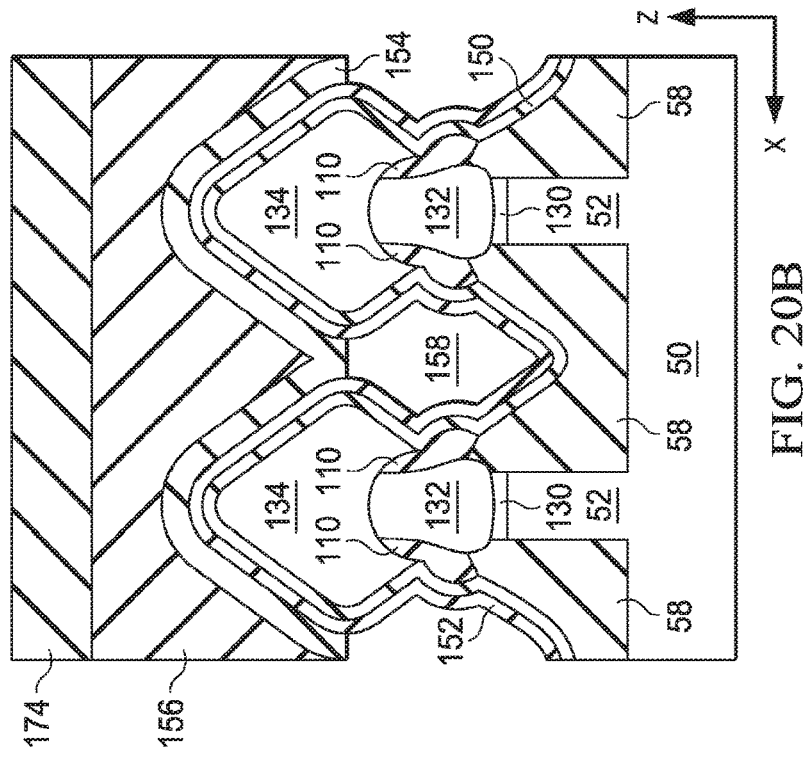
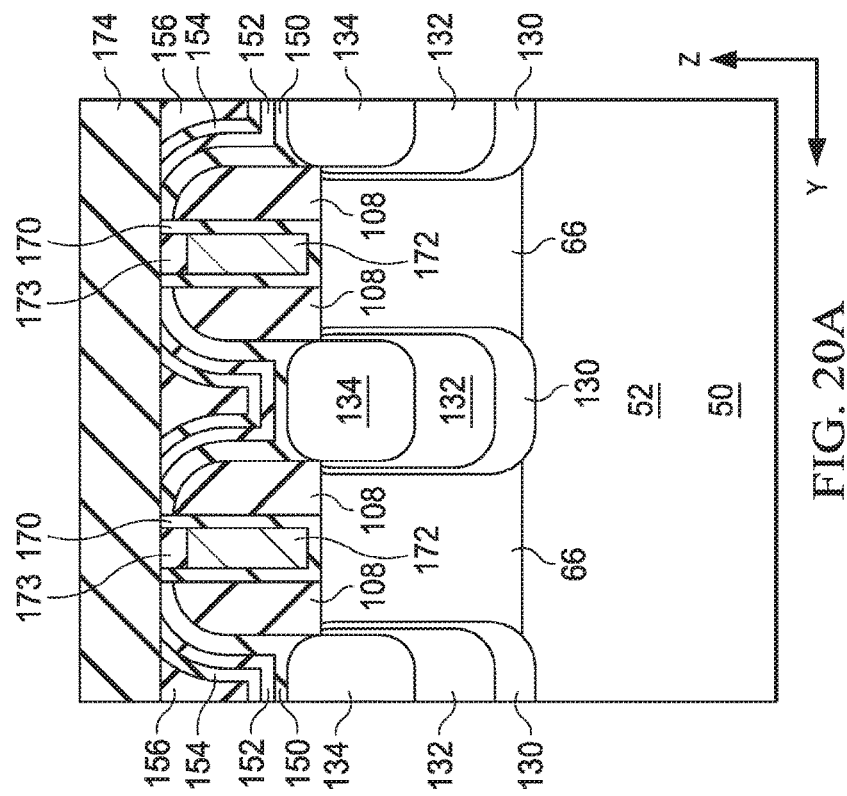
FIG. 20A
FIG. 20B

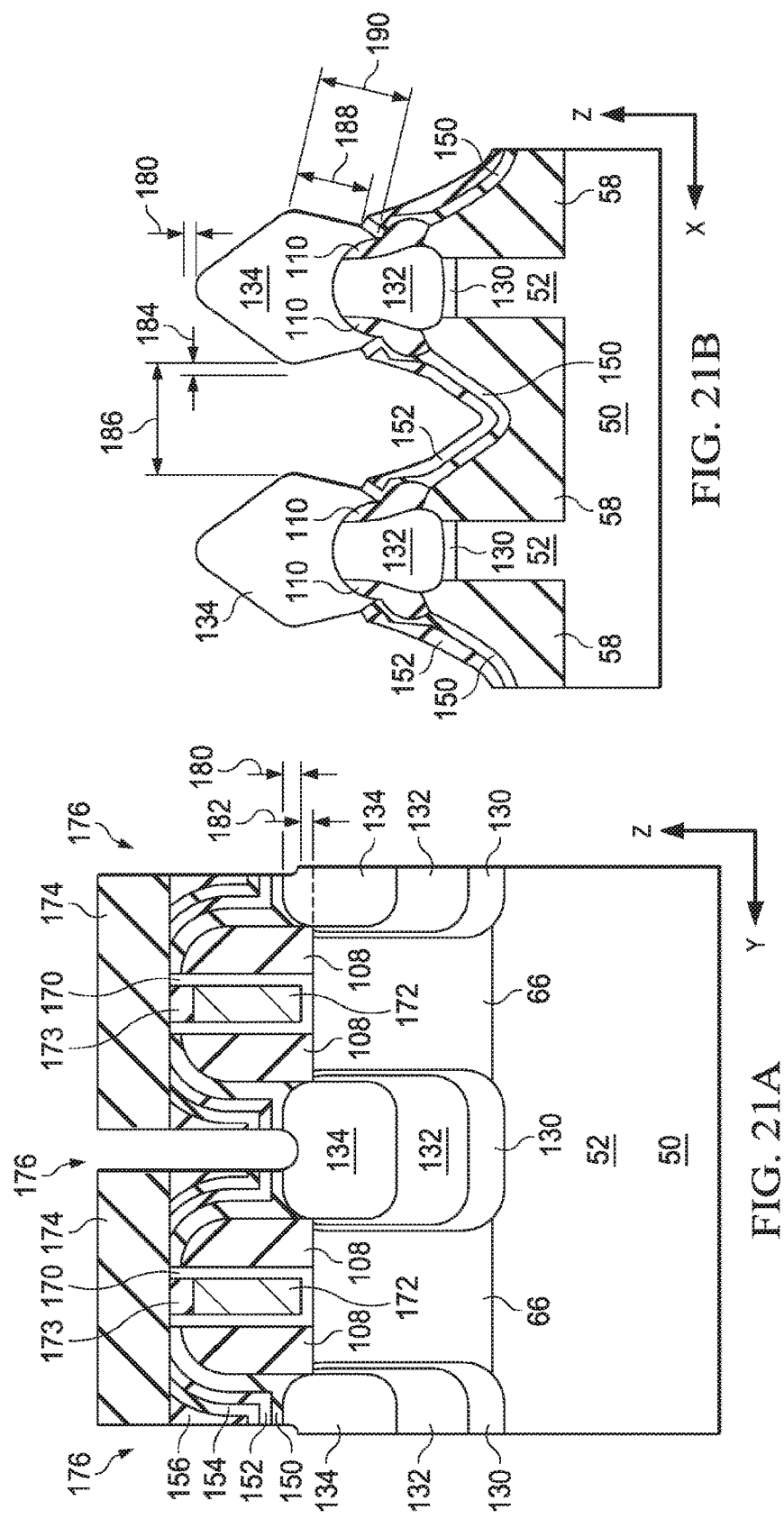

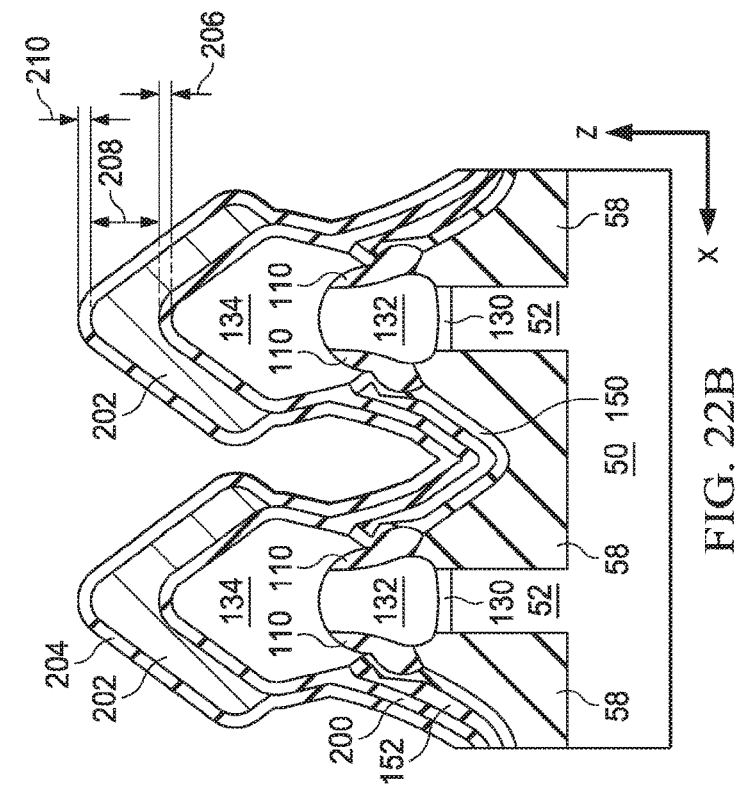
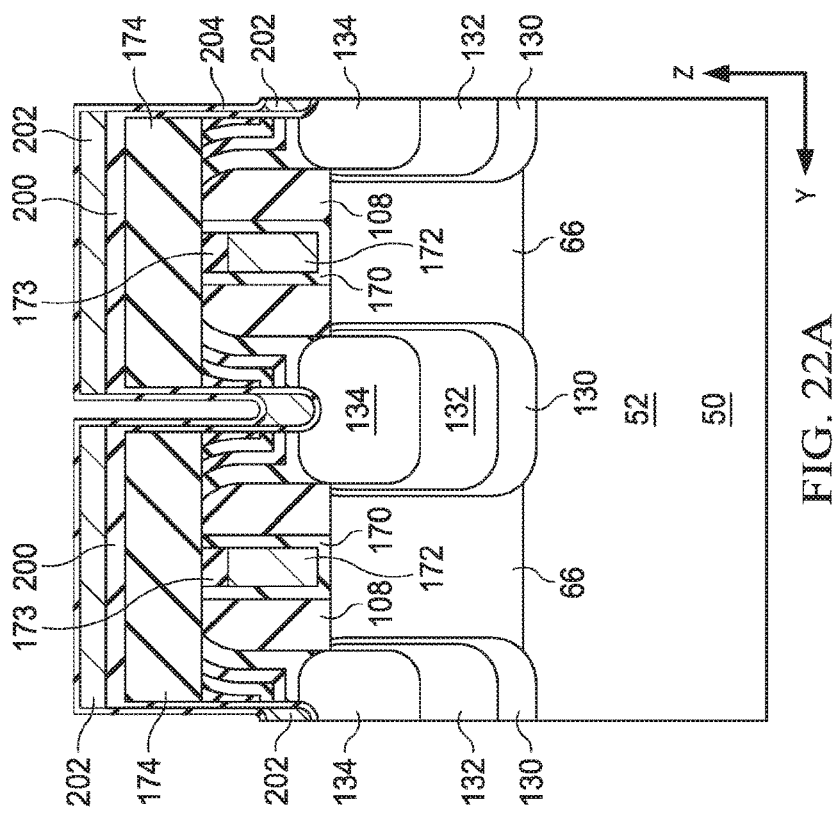
FIG. 22A
FIG. 22B

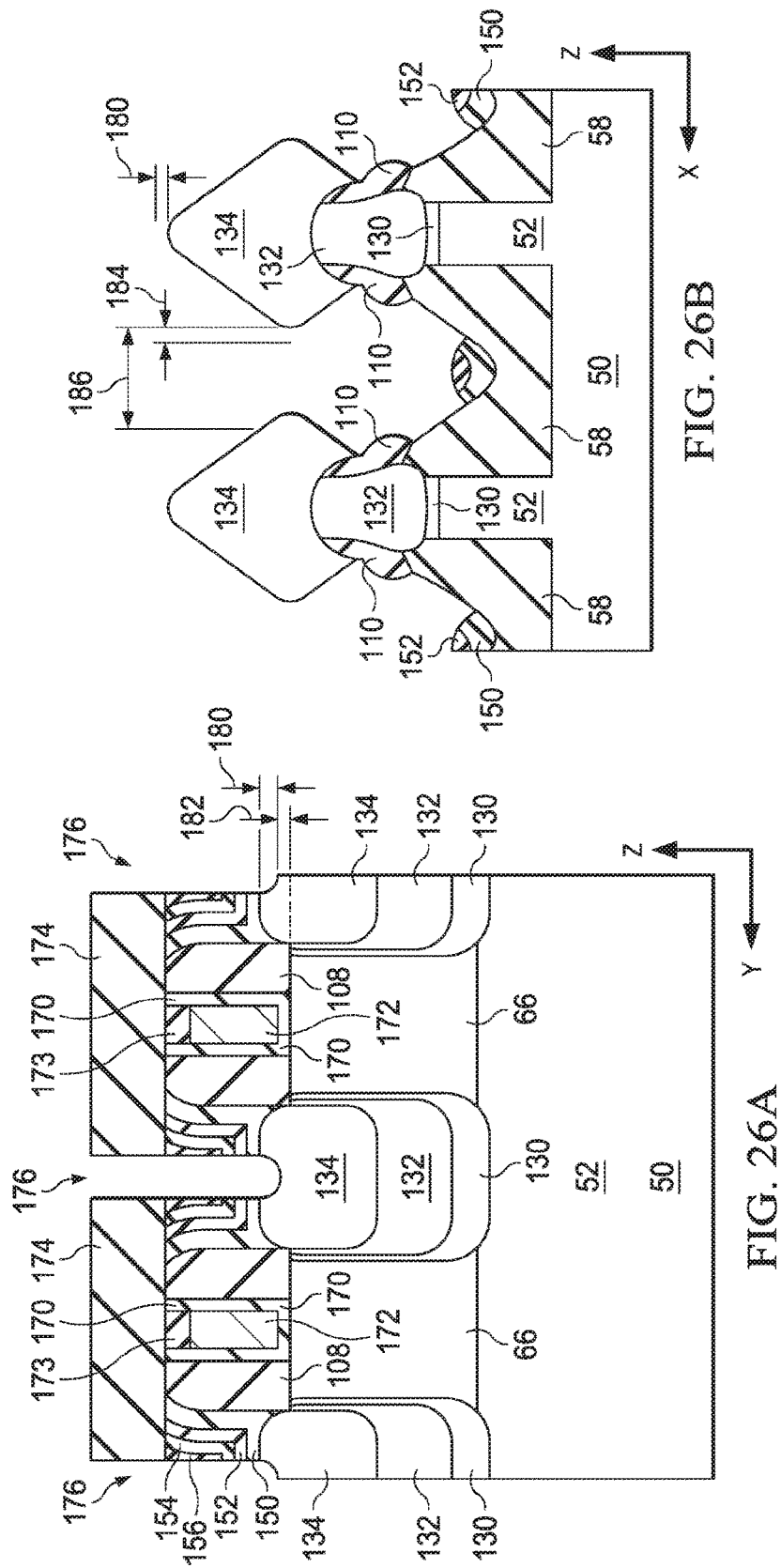

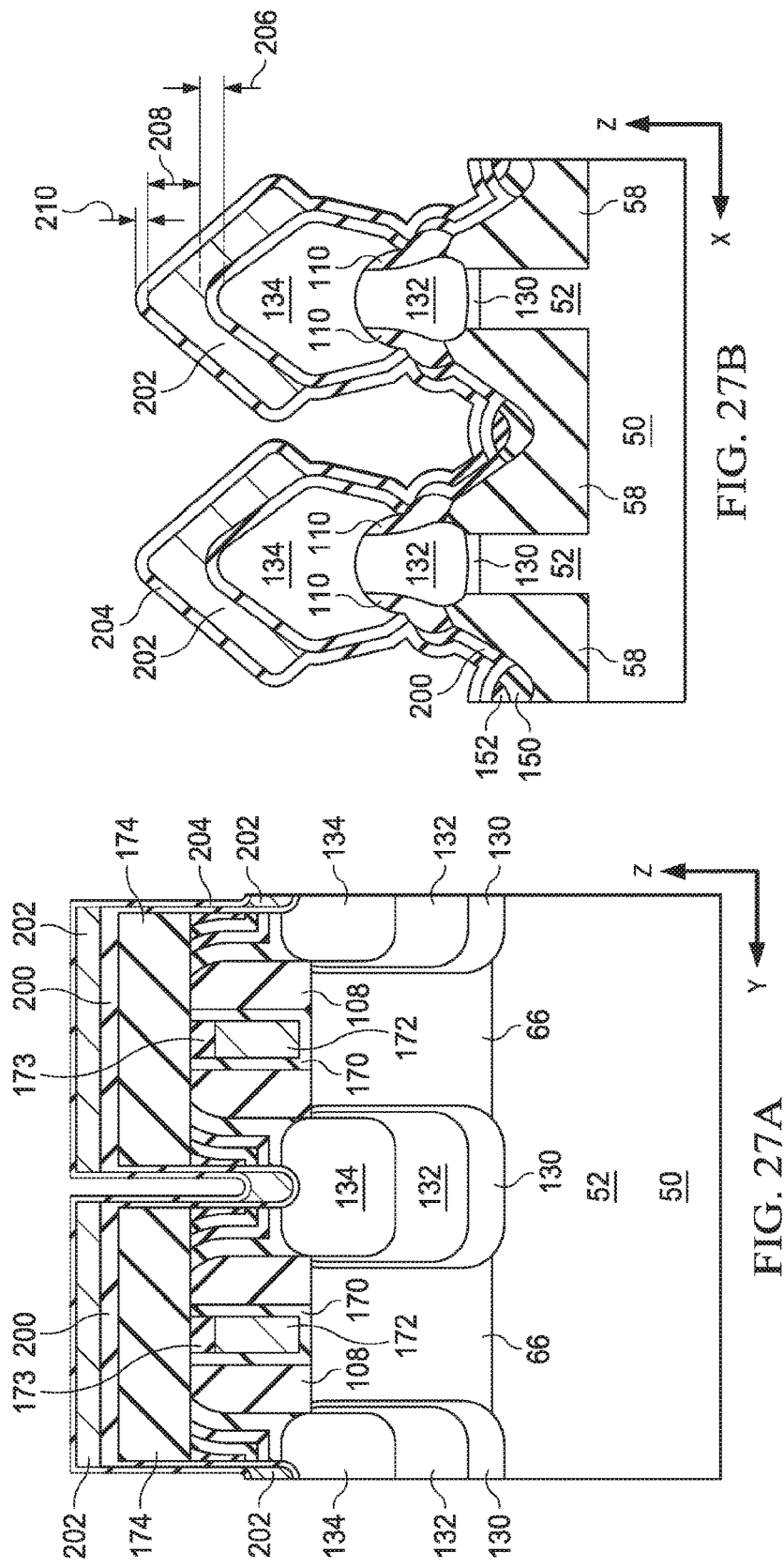

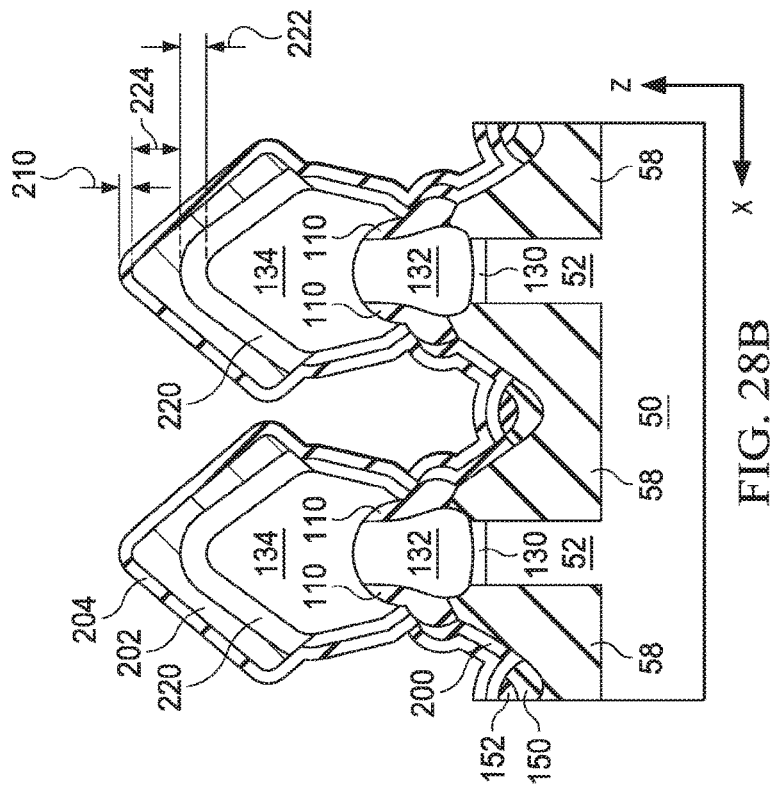
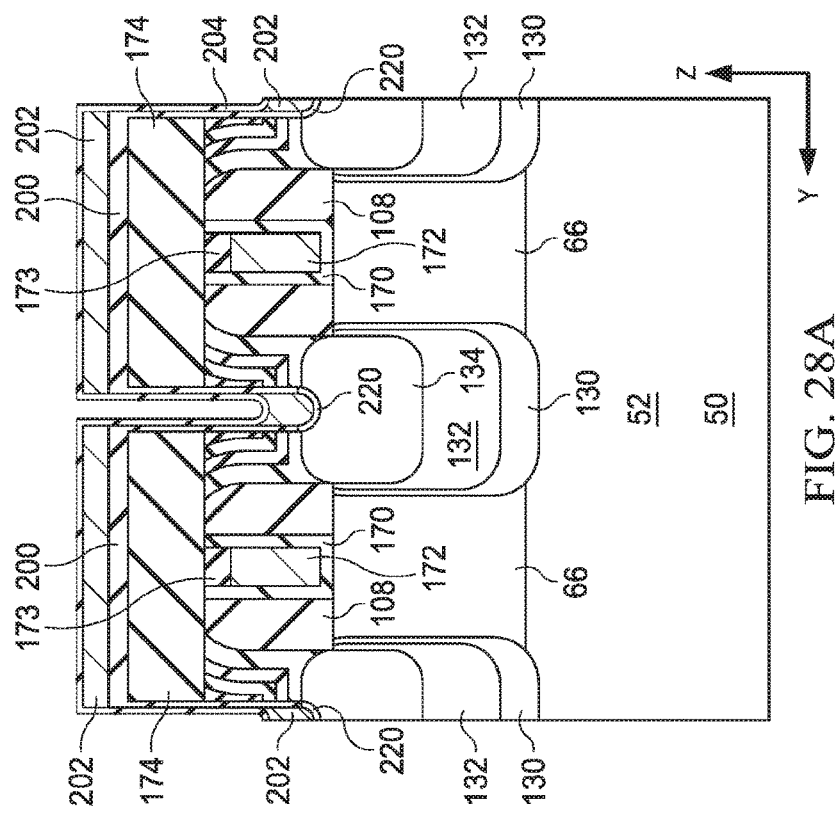
FIG. 28B
FIG. 28A

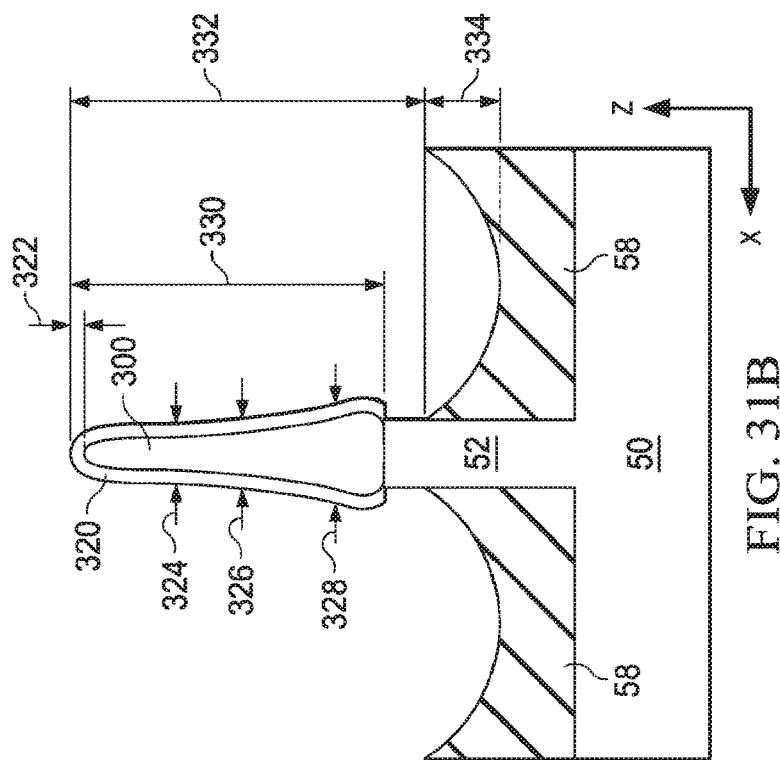
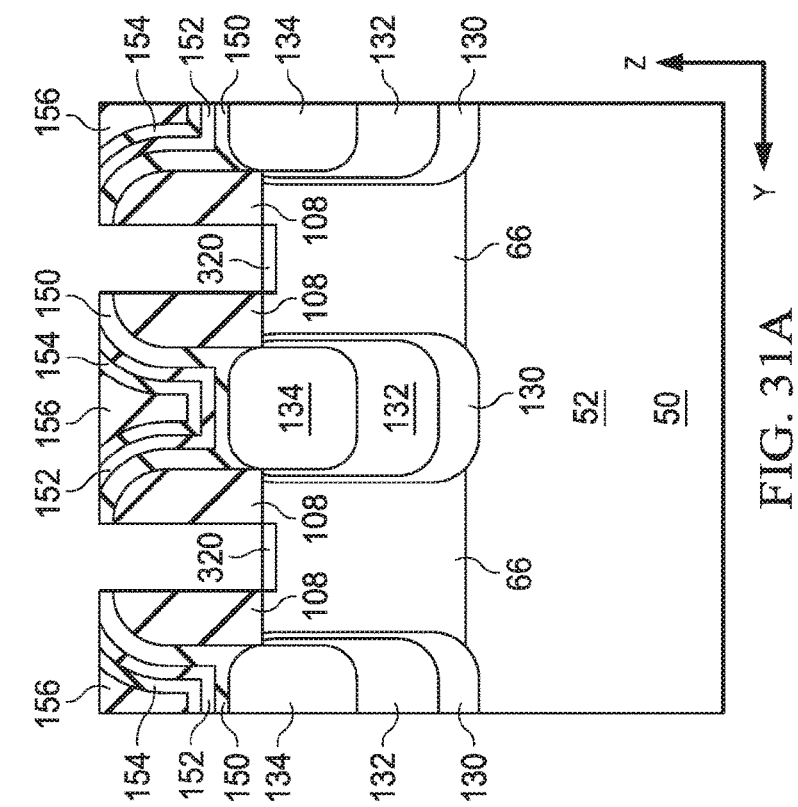
FIG. 31A
FIG. 31B

WRAP-AROUND CONTACT ON FINFET

PRIORITY CLAIM AND CROSS-REFERENCE

This application is a continuation of U.S. patent application Ser. No. 15/226,557, filed on Aug. 2, 2016, entitled "Wrap-Around Contact on FinFET," and issued as U.S. Pat. No. 9,941,367 on Apr. 10, 2018 which is a divisional of U.S. patent application Ser. No. 14/257,809, filed on Apr. 21, 2014, entitled "Wrap-Around Contact," and issued as U.S. Pat. No. 9,443,769 on Sep. 13, 2016 both of which applications are incorporated herein by reference.

BACKGROUND

Semiconductor devices are used in a large number of electronic devices, such as computers, cell phones, and others. Semiconductor devices typically comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 9, 10A-10B, 11A-11B, 12A-12B, 13A-13B, 14A-14B, 15A-15B, 16A-16B, 17A-17B, 18A-18B, 19A-19B, 20A-20B, 21A-21B, 22A-22B, 23A-23B, 24A-24B, and 25A-25B are steps of a first example method of forming a fin field effect transistor (FinFET) in accordance with some embodiments.

FIGS. 26A-26B, 27A-27B, and 28A-28B are steps of a second example method of forming a FinFET in accordance with some embodiments.

FIGS. 29A-29B, 30A-30B, 31A-31B, 32A-32B are steps of reshaping of a channel region of a fin that may occur during a gate replacement process in accordance with some embodiments.

DETAILED DESCRIPTION

Figure 2:
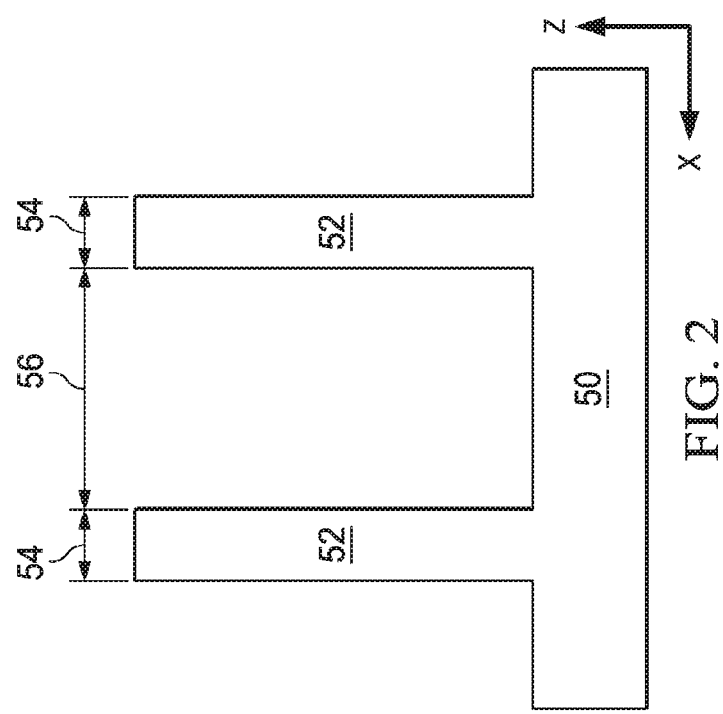

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed below are in reference to a specific context, namely forming a fin field effect transistor (FinFET). Aspects of this disclosure may be applied in other contexts, such as forming a contact for any device. Specific dimensions given below are for illustrative purposes for a given technology node, such as for 15 nm technology or smaller. Other embodiments contemplate different dimensions, particularly at different technology nodes. The figures discussed below are not necessarily drawn to scale.

Figure 1:
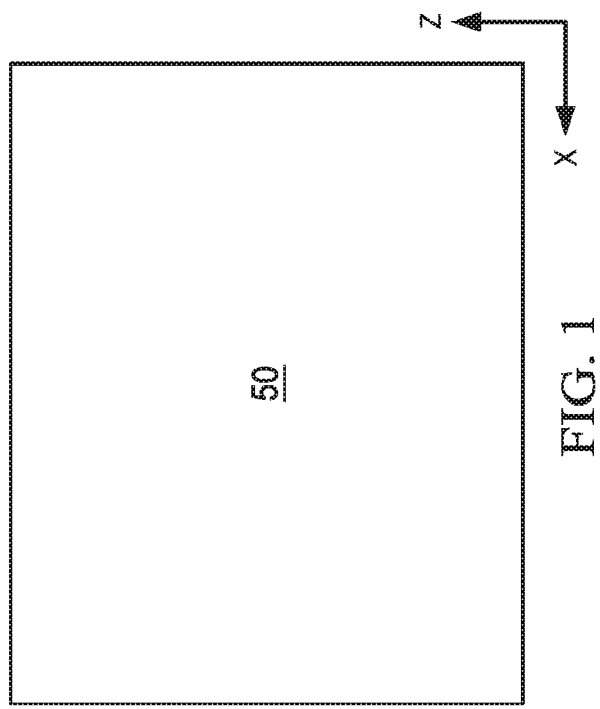

FIG. 1 through FIGS. 25A and 25B illustrate steps of a first example method of forming a FinFET. FIGS. 1 through 9 are cross sections along, for example, an X-Z plane. FIG. 1 illustrates a substrate 50, which may be, for example, a part of a wafer. Substrate 50 may be a semiconductor substrate, which may further be a silicon substrate, a silicon carbon substrate, a silicon germanium substrate, or a substrate formed of other semiconductor materials. The substrate 50 may be a bulk substrate, a semiconductor-on-insulator (SOI) substrate, or other acceptable substrates. The substrate 50 may be lightly doped with a p-type or an n-type impurity. In the illustrated embodiment of FIG. 1, the substrate 50 is a silicon wafer.

Figure 3:
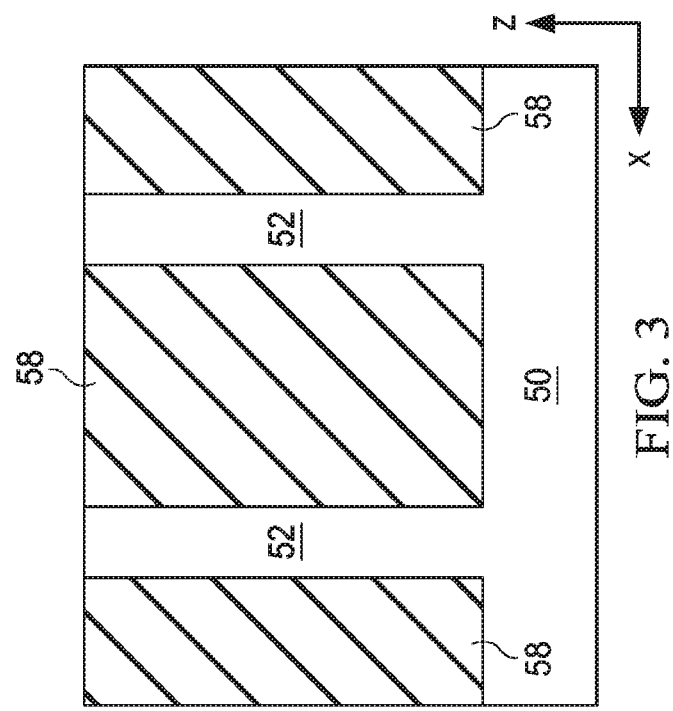

FIGS. 2 and 3 illustrate the formation of fins 52 and isolation regions 58 between neighboring fins 52. In FIG. 2, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. The fins 52 can have a width 54. Neighboring fins 52 may be distance 56 apart. A pitch between neighboring fins 52 may be the distance 56 plus the width 54. In the illustrate embodiment, the width 54 is between approximately 4 nm and approximately 16 nm, such as about 13 nm, and the distance 56 is between approximately 10 nm and approximately 44 nm, such as about 35 nm.

In FIG. 3, an insulation material is formed between neighboring fins 52 to form the isolation regions 58. The insulation material may be an oxide, such as silicon oxide, a nitride, the like, or a combination thereof, and may be formed by a high density plasma chemical vapor deposition (HDP-CVD) or a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. A planarization process, such as a chemical mechanical polish (CMP), may remove any excess insulation material and form top surfaces of the isolation regions 58 and top surfaces of the fins 52 that are co-planar.

Figure 4:
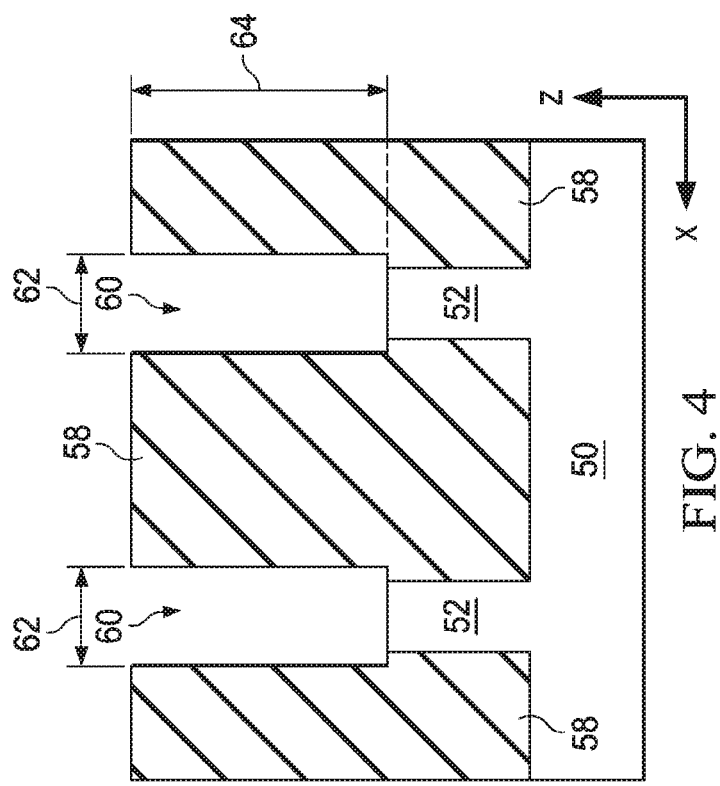

In FIG. 4, recesses 60 are formed in the fins 52 and/or the isolation regions 58. The recesses 60 may be formed by etching using any acceptable etch process, such as a RIE, NBE, tetramethyalammonium hydroxide (TMAH), ammonium hydroxide ($NH_4OH$), a wet etchant capable of etching silicon with good etch selectivity between silicon and a material of the isolation regions 58, the like, or a combination thereof. The etch may be anisotropic. Surfaces of the fins 52 are exposed as at least portions of the bottom surfaces of the recesses 60. As illustrated, the bottom surfaces of the recesses 60 include all of top surfaces of the fins 52 after an etching process. In other embodiments, some misalignment may occur such that a sidewall of the recess 60 includes a portion of a fin 52 and/or other configurations. Also as illustrated, the bottom surfaces of the recesses 60 include surfaces of the isolation regions 58. This may result when widths 62 of the recesses 60 are greater than the widths 54 of the fins 52. The recesses 60 also have depths 64. As illustrated, the depths 64 are such that some of the fins 52 remain after the etching process. The recesses 60 may have depths 64 such that fins 52 are wholly removed and/or the recesses 60 extend into the substrate 50. In the illustrated embodiment, the widths 62 are between approximately 14.7 nm and approximately 16.3 nm, such as about 15.5 nm, and the depths 64 are between approximately 38.5 nm and approximately 40.5 nm, such as about 39.5 nm.

Figure 5:
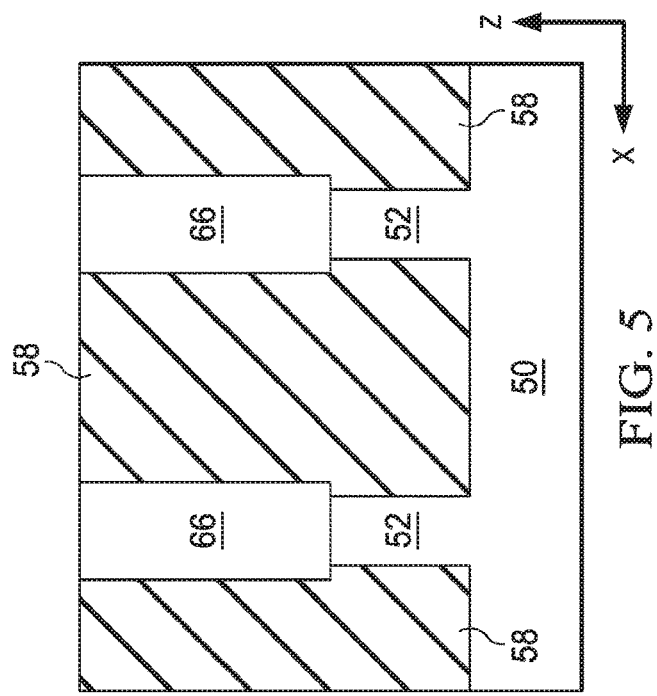

In FIG. 5, epitaxial fins 66 are formed in the recesses 60. In some embodiments, the epitaxial fins 66 are formed by epitaxially growing a material in the recesses 60, such as by metal-organic CVD (MOCVD), molecular beam epitaxy (MBE), liquid phase epitaxy (LPE), vapor phase epitaxy (VPE), selective epitaxial growth (SEG), the like, or a combination thereof. In the illustrated embodiment, the epitaxial fins 66 are silicon germanium, where the concentration of germanium is 45% (e.g., $Si_{1-x}Ge_x$, where x=0.45). In other embodiments the concentration of germanium (e.g., the value of x) can be any amount from 0 to 100%, and in still other embodiments, the epitaxial fins 66 can comprise or consist essentially of other material, such as silicon, silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. A planarization process, such as a CMP process, may be used to form the top surfaces of the epitaxial fins 66 and the isolation regions 58 to be co-planar.

Figure 6:
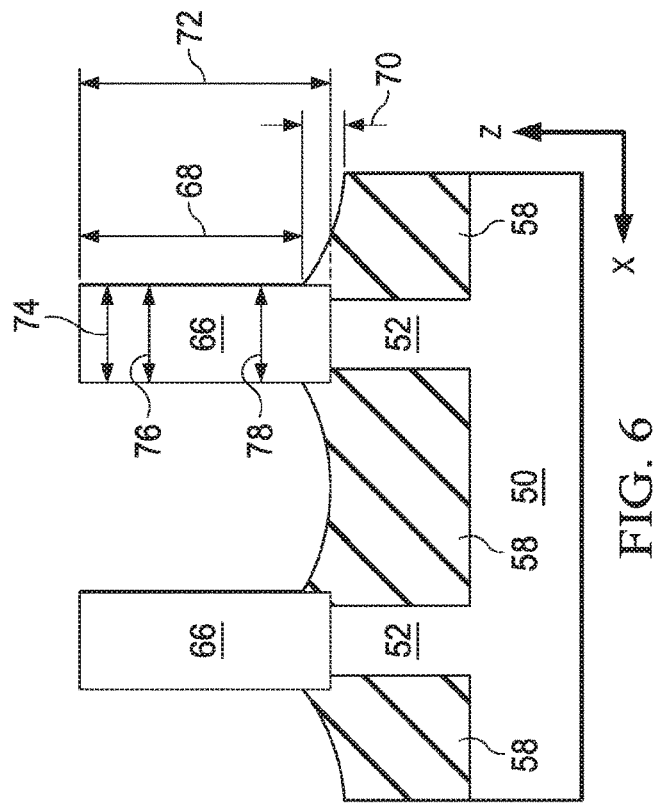

In FIG. 6, the isolation regions 58, which may also be referred to as Shallow Trench Isolation (STI) regions, are recessed. The isolation regions 58 are recessed such that epitaxial fins 66 protrude from between neighboring isolation regions 58. The isolation regions 58 may be recessed using an acceptable etching process, such as one that is selective to the material of the isolation regions 58. For example, a chemical oxide removal using a CERTAS® etch or an Applied Materials SICONI tool or dilute hydrofluoric (dHF) acid may be used. In some embodiments, the epitaxial fins 66 may have some loss due to the recessing of the isolation regions 58. For example, in the illustrated embodiment, an epitaxial fin height (e.g., in the Z-direction) loss may be approximately 0.5 nm, and an epitaxial fin width (e.g., in the X-direction) loss may be approximately 1 nm. In the illustrated embodiment, the fin height 68, e.g., the portion of the epitaxial fin 66 and/or fin 52 protruding from neighboring isolation regions 58, is between approximately 32 nm to approximately 34 nm, such as about 33 nm, and the epitaxial fin height 72 is between approximately 38 nm to approximately 40 nm, such as about 39 nm. A difference between the epitaxial fin height 72 and the fin height 68 in the illustrated embodiment is between approximately 4 nm and approximately 8 nm, such as about 6 nm. Further, as a result of the recessing, the isolation regions 58 may have dishing, and in the illustrated embodiment, a dishing depth 70 is less than 5 nm, such as approximately 4 nm. In the illustrated embodiment, a width 74 at a depth of 5 nm, a width 76 at a depth of 15 nm, and a width 78 at a depth of 30 nm from the top of the epitaxial fin 66 are each between approximately 13.8 nm and 15.2 nm, such as about 14.5 nm.

Figure 7:
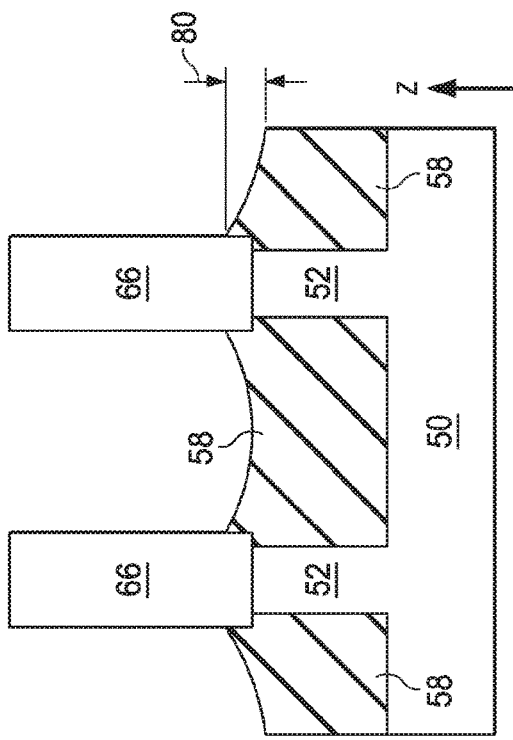

In FIG. 7, n-wells and/or p-wells are formed in the epitaxial fins 66, fins 52, and/or substrate 50 in various regions. For example, a photoresist can be formed over the epitaxial fins 66, fins 52, substrate 50 and/or the isolation regions 58. The photoresist can be patterned to expose a region of the epitaxial fins 66, fins 52, and/or substrate 50, such as an NFET region, by using a spin-on technique and acceptable photolithography techniques. Once patterned, a p-type impurity implant may be performed in the NFET region. The p-type impurities may be boron, $BF_2$, or the like implanted in the NFET region to a concentration of equal to or less than $7\times10^{18}$ $cm^{-3}$, such as between about $10^{15}$ $cm^{-3}$ and about $7\times10^{18}$ $cm^{-3}$. After the implant, the photoresist may be removed, such as by an acceptable ashing process, which may include an oxygen-containing plasma. Another photoresist may be patterned to expose another region of the epitaxial fins 66, fins 52, and/or substrate 50, such as a PFET region, using similar techniques, and an n-type impurity implant may be performed in the PFET region. The n-type impurities may be phosphorus, arsenic, or the like implanted in the PFET region to a concentration of equal to or less than $7\times10^{18}$ $cm^{-3}$, such as between about $10^{15}$ $cm^{-3}$ and about $7\times10^{18}$ $cm^{-3}$. After the implant, the photoresist may be removed, such as by an acceptable ashing process, which may include an oxygen-containing plasma. After the implants, an anneal may be performed to activate the p-type and n-type impurities that were implanted. The implantations may form a p-well in the NFET region and an n-well in the PFET region. In the illustrated embodiment, an ashing process(es) can cause increased dishing in the isolation regions 58, such as to a dishing depth 80 between approximately 2 nm and approximately 8 nm, like 5 nm.

A person having ordinary skill in the art will readily understand that the process described with respect to FIGS. 1 through 7 is just one example of how epitaxial fins 66 may be formed. In other embodiments, a dielectric layer can be formed over a top surface of the substrate 50; trenches can be etched through the dielectric layer; homo-epitaxial structures or hetero-epitaxial structures can be epitaxially grown in the trenches; and the dielectric layer can be recessed such that the homo-epitaxial structures or hetero-epitaxial structures protrude from the dielectric layer to form fins. The grown materials may be in situ doped during growth, which may obviate some implantations, although in situ and implantation doping may be used together. Still further, it may be advantageous to epitaxially grow a material in an NFET region different from the material in a PFET region.

Figure 8:
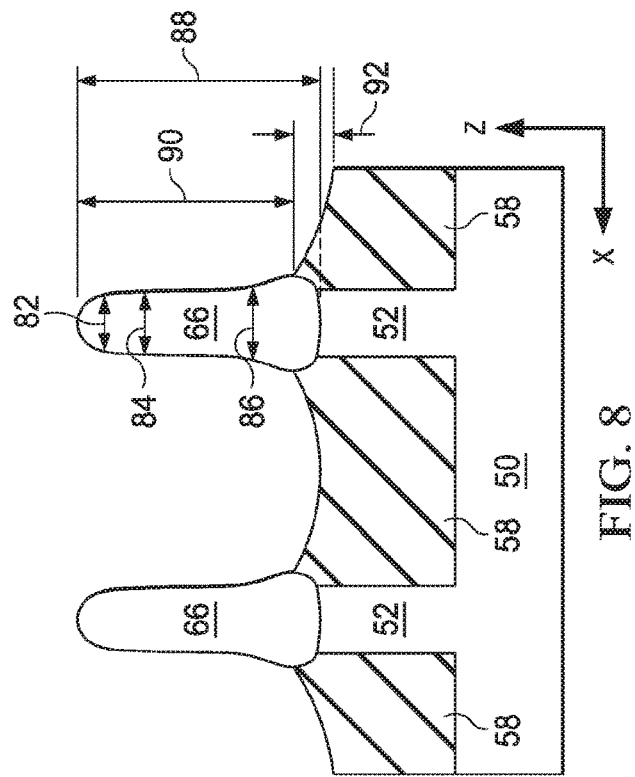

In FIG. 8, the epitaxial fins 66 are reshaped. The fin reshaping may be performed using a wet cleaning process and a CERTAS® etch, for example. The wet cleaning may comprise an immersion in a solution comprising an etching species. The etching species can comprise ammonium hydroxide (NH$_4$OH), an ammonia peroxide mixture (APM), hydrochloric acid (HCl), dHF, a combination thereof, or the like. The etching species can have a concentration between about 0.2 percent and about 20 percent in the solution. The wet etch can include immersion in the solution from about 20 seconds to about 600 seconds and can be at a temperature of about 20° C. to about 60° C.

The CERTAS® etch can introduce hydrogen fluoride (HF) and ammonia (NH$_3$) as etchants to react with each other and with the oxide present on the epitaxial fins 66 to form (NH$_4$)$_2$SiF$_6$ on the surfaces of the epitaxial fins. As the (NH$_4$)$_2$SiF$_6$ is formed on the surfaces of the epitaxial fins 66, the (NH$_4$)$_2$SiF$_6$ will act as a diffusion barrier layer that will prevent the further diffusion of HF and NH$_3$ into the epitaxial fins 66. As such, the CERTAS® etch may be self-limiting, as the formation of (NH$_4$)$_2$SiF$_6$ will prevent further formation of (NH$_4$)$_2$SiF$_6$ at a deeper depth within the epitaxial fins. The precise depth to which the (NH$_4$)$_2$SiF$_6$ will form may be adjusted based on process conditions, such as temperature, pressure, and flow rates of the etchants. Once the reaction has effectively self-terminated, the epitaxial fins 66 (along with the substrate 50) may be heated using an annealing process in order to remove the (NH$_4$)$_2$SiF$_6$, thereby reducing the thickness of the epitaxial fins 66 by the thickness of the (NH$_4$)$_2$SiF$_6$ and also exposing a remaining portion of the epitaxial fins 66 for further processing. The heat may cause the (NH$_4$)$_2$SiF$_6$ to thermally decompose to N$_2$, H$_2$O, SiF$_4$, and NH$_3$, all of which may become vapor and may be removed from the surface of the epitaxial fins 66 by the annealing process. In an embodiment of the annealing process be at a temperature of between about 80° C. to about 200° C., such as about 100° C. for between about 60 seconds to about 180 seconds to remove the (NH$_4$)$_2$SiF$_6$. The CERTAS® etch process may be performed multiple times to achieve a desired reshaping effect. Other processes may also be used to reshape the epitaxial fins 66.

As a result of the reshaping in the illustrated embodiment, an epitaxial fin height loss may be approximately 3 nm, and an epitaxial fin width loss may vary, such as by as much as 6.5 nm. In the illustrated embodiment, a width 82 at a depth of 5 nm from the top of the epitaxial fin 66 is between approximately 7.6 nm and approximately 8.4 nm, like 8 nm; a width 84 at a depth of 15 nm from the top of the epitaxial fin 66 is between approximately 9.4 nm and approximately 10.6 nm, like about 10 nm; and a width 86 at a depth of 30 nm from the top of the epitaxial fin 66 is between approximately 13 nm and approximately 15 nm, like about 14 nm. In the illustrated embodiment, the fin height 90, e.g., the portion of the epitaxial fin 66 and/or fin 52 protruding from neighboring isolation regions 58, is between approximately 31 nm to approximately 33 nm, such as about 32 nm, and the epitaxial fin height 88 is between approximately 35 nm to approximately 37 nm, such as about 36 nm. A difference between the epitaxial fin height 88 and the fin height 90 in the illustrated embodiment is greater than about 2 nm. Further, as a result of the reshaping, the isolation regions 58 may have further dishing, and in the illustrated embodiment, a dishing depth 92 is between approximately 6 nm and approximately 8 nm, like about 7 nm.

Figure 9:
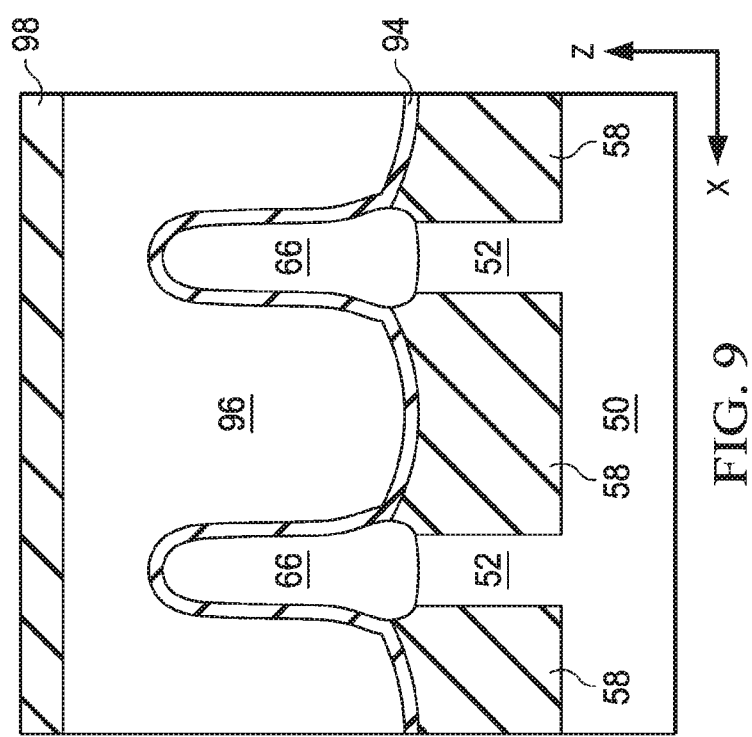

FIG. 9 illustrates a dummy dielectric layer 94 formed over the epitaxial fins 66 and the isolation regions 58, a dummy gate layer 96 over the dummy dielectric layer 94, and a mask layer 98 over the dummy gate layer 96. In an embodiment, dummy dielectric layer 94 comprises silicon oxide, silicon nitride, silicon carbon nitride, silicon oxynitride, silicon carbide, silicon oxycarbide, any material that may be removable with a wet etch with selectivity, or the like. The formation methods of dummy dielectric layer 94 may include Atomic Layer Deposition (ALD), CVD, Plasma Enhanced CVD (PECVD), a furnace deposition process, thermal oxidation, or the like. The dummy gate layer 96 may comprise polysilicon or any acceptable sacrificial material. The dummy gate layer 96 may be deposited using CVD, ALD, physical vapor deposition (PVD), the like, or a combination thereof. The mask layer 98 may comprise silicon nitride, silicon oxide, silicon oxynitride, the like, or a combination thereof, and may be deposited using CVD, ALD, PVD, the like, or a combination thereof. In the illustrated embodiment, a thickness of the dummy dielectric layer 94 is between approximately 2 nm and approximately 6 nm; a thickness of the dummy gate layer 96 at a point above the epitaxial fin 66 is between approximately 60 nm and approximately 120 nm; and a thickness of the mask layer 98 is between approximately 20 nm and approximately 60 nm.

Figures following FIG. 9 illustrate various cross sections during processing. Figures in ending in "A" illustrate a cross-section in a Y-Z plane, and figures in ending in "B" illustrate a cross-section in an X-Z plane. FIG. 10A illustrates an example cross section B-B that corresponds to the cross section used in following figures ending in "B," until indicated otherwise. Similarly, FIG. 10B illustrates an example cross section A-A that corresponds to the cross section used in following figures ending in "A," until indicated otherwise.

Figure 10B:
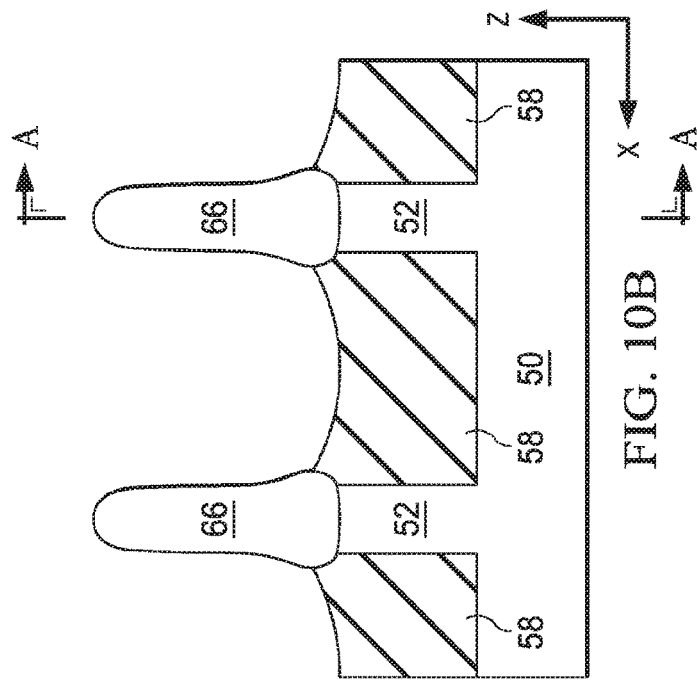
Figure 10A:
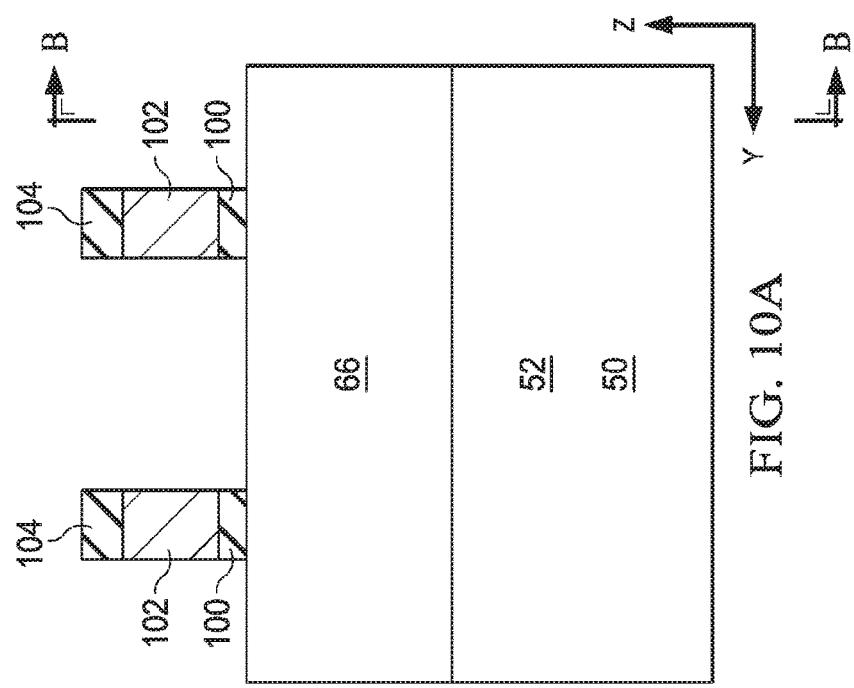

In FIGS. 10A and 10B, the mask layer 98, the dummy gate layer 96, and the dummy dielectric layer 94 are patterned to form masks 104, dummy gates 102, and dummy dielectrics 100, respectively. Two gate structures, each including a dummy dielectric 100 and a dummy gate 102, are illustrated. The patterning may use an acceptable photolithography and etch process(es), such as an RIE, CCP, ICP, the like, or a combination thereof. The etch may be selective to a desired material and may be anisotropic. The gate structures may define respective channel regions of transistors under gate structures and in the epitaxial fins 66. In the illustrated embodiment, a width of the gate structures, e.g., in the Y-direction, may be 30 nm for the discussed technology node.

Figure 11A:
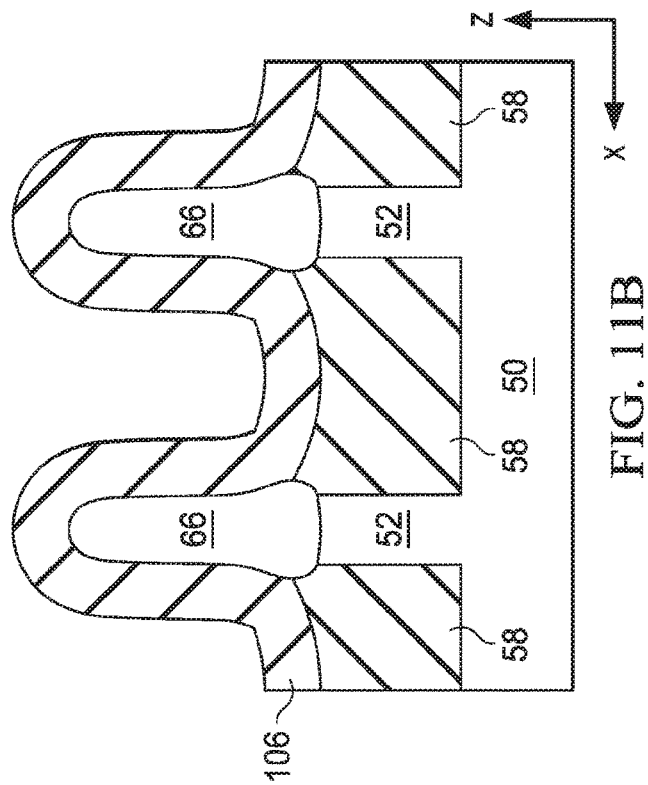
Figure 11B:
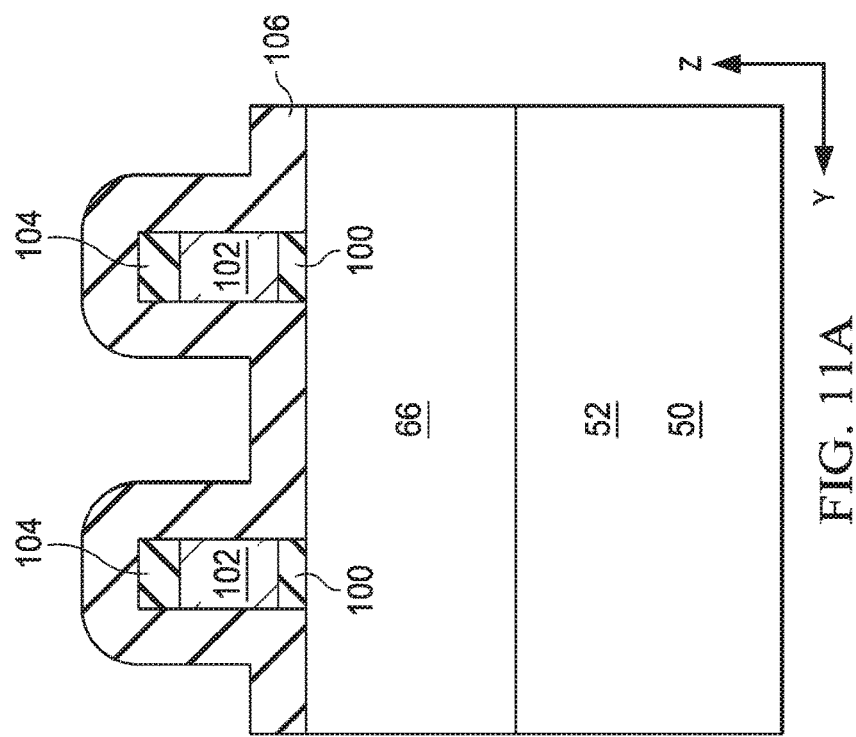

In FIGS. 11A and 11B, a spacer layer 106 is conformally deposited over the structure in FIGS. 10A, and 10B. Specifically, the spacer layer 106 is illustrated as being conformally over top surfaces and along sidewall surfaces of the epitaxial fin 66, over a top surface and along sidewall surfaces of the gate structures including the dummy dielectrics 100, dummy gates 102, and masks 104, and over or along top surfaces of the isolation regions 58. The spacer layer 106 may be silicon nitride (SiN), silicon carbon-nitride (SiCN), silicon carbon-oxynitride (SiCON), the like, or a combination thereof, formed by CVD, ALD, the like, or a combination thereof. In the illustrated embodiment, the spacer layer 106 has a thickness, e.g., orthogonal to an underlying surface, between approximately 9 nm and approximately 11 nm, such as 10 nm.

Figure 12B:
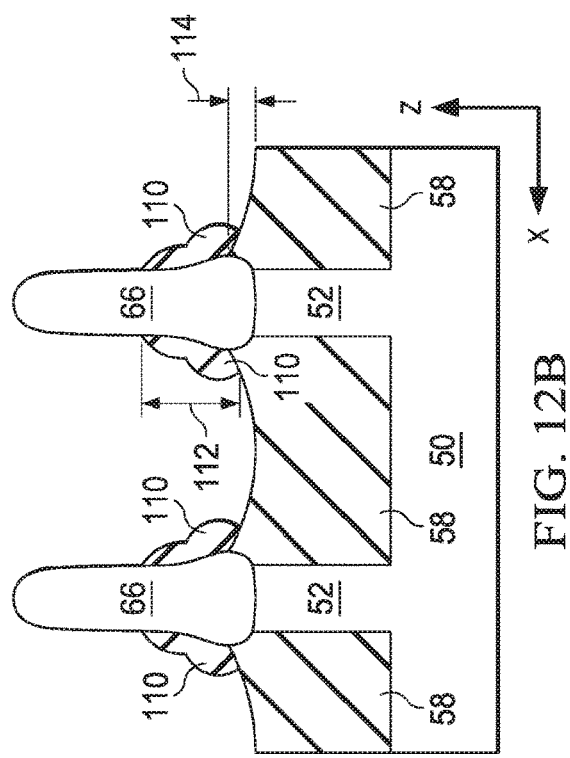
Figure 12A:
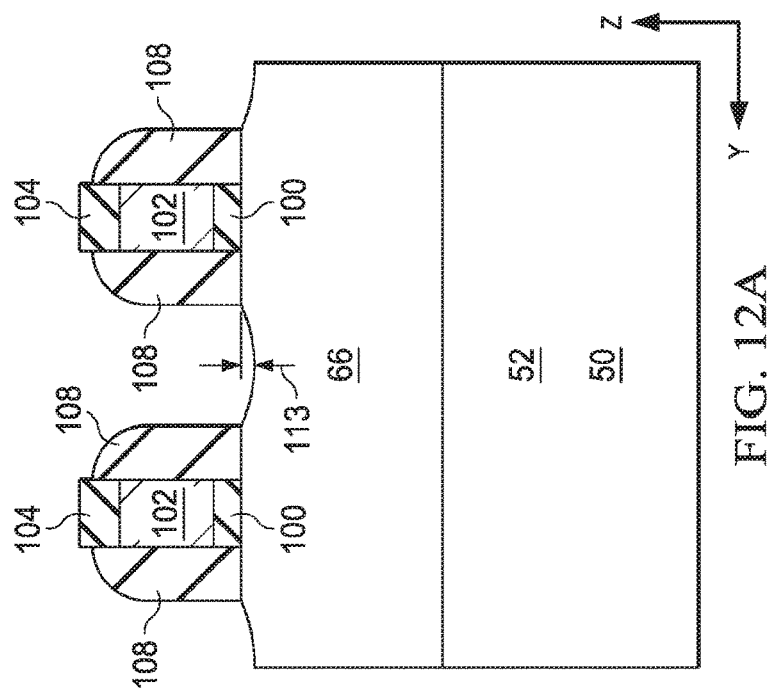

In FIGS. 12A and 12B, the spacer layer 106 is anisotropically etched to form gate spacers 108 on sidewalls of the gate structure, e.g., at least adjoining the dummy gate 102. The gate spacers 108 may also remain on sidewalls of the dummy dielectrics 100 and/or masks 104. Also as a result of this etch, barrier portions 110 of the spacer layer 106 remain at junctions of portions the isolation regions 58 and sidewalls of the epitaxial fin 66. The etch may be an RIE, CCP, ICP, transformer coupled plasma (TCP), a high density plasma (HDP) etch, electron cyclotron resonance (ECR) etch, the like, or a combination thereof. The etch may be selective to the spacer layer 106.

In the illustrated embodiment, the barrier height 112 of the barrier portions 110 is between approximately 10 nm and approximately 24 nm, such as about 16 nm, and widths of the gate spacers 108, e.g., in the Y-direction, are between approximately 8 nm and approximately 10 nm, such as about 9 nm, at an interface between the dummy gate 102 and the mask 104 and between approximately 9 nm and approximately 11 nm, such as about 10 nm, proximate a top of the epitaxial fin 66. Additionally, the etching process may result in loss of some of the epitaxial fin 66 and the isolation regions 58. In the illustrated embodiment, an epitaxial fin loss 113 is between approximately 8 nm and approximately 10 nm, such as about 9 nm, and dishing depth 114 of the isolation regions 58 is less than approximately 11 nm, such as between approximately 9 nm and approximately 11 nm, like about 10 nm.

In FIGS. 13A and 13B, portions of the epitaxial fins 66 and/or fins 52 are recessed, such as by an etch, like an isotropic etch, to form recesses 116. The etch process may use RIE, NBE, TMAH, NH$_4$OH, a wet etchant capable of etching the recesses 116 with good etch selectivity between a material(s) of the epitaxial fin 66 and/or the fin 52 and a material of the isolation regions 58, the like, or a combination thereof. The recesses 116 may extend to a depth 118 that is above, to, or below an interface between the epitaxial fin 66 and the fin 52 (if present) or the substrate 50. In embodiments where portions of the fin 52 and/or substrate 50 are removed, an etch may etch the epitaxial fin 66, fin 52, and/or the substrate 50 during a same process step or in multiple process steps. As illustrated, the depth 118 of the recess 116 extends below an interface between the epitaxial fin 66 and the fin 52, and extends between approximately 15 and approximately 70 nm, such as about 51 nm. As illustrated, a surface of the fin 52 defines a bottom surface of the recess 116, although in other embodiments a surface of the epitaxial fin 66 or the substrate 50 can define a bottom surface of the recess 116. The recess 116, as illustrated, is also defined in part by the barrier portions 110.

In FIGS. 14A and 14B, first epitaxial regions 130, second epitaxial regions 132, and third epitaxial regions 134 are epitaxially grown. The first epitaxial regions 130 are grown from crystalline surfaces of the recesses 116, e.g., the surfaces of the fin 52 and epitaxial fin 66. The second epitaxial regions 132 are grown from the first epitaxial regions 130, and the third epitaxial regions 134 are grown from the second epitaxial regions 132. As illustrated, the first epitaxial regions 130 are thin layers, and the second epitaxial regions 132 do not extend significantly beyond the barrier portions 110. In other embodiments, the first epitaxial regions 130 can have any acceptable thickness, and the second epitaxial regions 132 may or may not extend above the barrier portions 110. The barrier portions 110 define the growth of the second epitaxial regions 132 along a Y-direction. The third epitaxial regions 134 extend beyond the barrier portions 110 in X-directions and in Y-directions. As illustrated, the third epitaxial regions 134 have a rhombus-like shape, e.g., a width of a third epitaxial region 134 increases from a bottom portion to a mid-portion and then decreases from the mid-portion to a top portion. This shape may essentially conform to <111> facet surfaces. For example, each of the upper surfaces and under-surfaces of the third epitaxial regions 134 may be a <111> surface. Other shapes may be formed. For example, an epitaxial growth process may grow different shapes for different fins despite the growth occurring in the same process. Portions of the third epitaxial regions 134 may be formed within barrier portions 110 in other embodiments.

In the illustrated embodiment, the first epitaxial regions 130 have a thickness 136 (e.g., not including a thickness due to growth on sidewalls of the recesses 116) between approximately 8.5 nm and approximately 11.5 nm, such as about 10 nm; the second epitaxial regions 132 have a thickness 138 (e.g., not including a thickness due to growth on sidewalls of the first epitaxial regions 130) between approximately 10 nm and approximately 20 nm, such as 15 nm; and the third epitaxial regions 134 have a height 140 between approximately 33.5 nm and approximately 36.5 nm, such as 35 nm. Further, in the illustrated embodiment, a narrowest spacing 148 between neighboring third epitaxial regions 134 is between approximately 8 nm and approximately 14 nm, such as about 10 nm.

The first epitaxial regions 130, second epitaxial regions 132, and third epitaxial regions 134 may comprise or consist essentially of silicon, silicon carbide, germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. The first epitaxial regions 130, second epitaxial regions 132, and third epitaxial regions 134 may be epitaxially grown using MOCVD, MBE, LPE, VPE, SEG, the like, or a combination thereof. In the illustrated embodiment, the first epitaxial regions 130 are silicon germanium, where the concentration of germanium is 45% (e.g., $Si_{1-x}Ge_x$, where x=0.45); the second epitaxial regions 132 are silicon germanium, where the concentration of germanium is 65% (e.g., $Si_{1-x}Ge_x$, where x=0.65); and the third epitaxial regions 134 are silicon germanium, where the concentration of germanium is 65% (e.g., $Si_{1-x}Ge_x$, where x=0.65). In some embodiments, one or more of the first epitaxial regions 130, second epitaxial regions 132, and third epitaxial regions 134 may be omitted, or additional epitaxial regions may be added. For example, in an embodiment, the first epitaxial regions 130 are omitted.

The first epitaxial regions 130, second epitaxial regions 132, and third epitaxial regions 134 may further be doped to appropriate concentrations. The doping may be by implant and/or may be by in situ doping during growth. In the illustrated embodiment, the first epitaxial regions 130 are doped to a concentration between approximately $5 \times 10^{19}$ cm$^{-3}$ and approximately $7 \times 10^{20}$ cm$^{-3}$, such as about $2 \times 10^{20}$ cm$^{-3}$; the second epitaxial regions 132 are doped to a concentration between approximately $5 \times 10^{19}$ cm$^{-3}$ and approximately $7 \times 10^{20}$ cm$^{-3}$, such as about $2 \times 10^{20}$ cm$^{-3}$; and the third epitaxial regions 134 are doped to a concentration between approximately $2 \times 10^{20}$ cm$^{-3}$ and approximately $3 \times 10^{21}$ cm$^{-3}$, such as about $1 \times 10^{21}$ cm$^{-3}$. The dopants may include, for example, boron, indium, or the like for a p-type transistor, and may include, for example, phosphorus, arsenic, or the like for an n-type transistor. In the illustrated embodiment, the dopant includes boron. Other embodiments contemplate no doping or different doping concentrations.

In some embodiments, a cleaning step may be used before the epitaxial growth of the first epitaxial regions 130, second epitaxial regions 132, and third epitaxial regions 134. If so, some loss of the barrier portions 110 and further dishing of the isolation regions 58 may occur. An example cleaning step includes using hydrofluoric acid (HF), SICONI, tris-borate-ethylene diamine tetraacetic acid (TBE), a buffered oxide etch (BOE), the like, or a combination thereof. In the illustrated embodiment, the barrier height 144 of the barrier portions 110 after a cleaning step and before the epitaxial growth is between approximately 11 nm and approximately 13 nm, such as about 12 nm, and the dishing depth 142 of the isolation regions 58 is between approximately 19 nm and approximately 23 nm, such as about 21 nm.

Figure 15B:
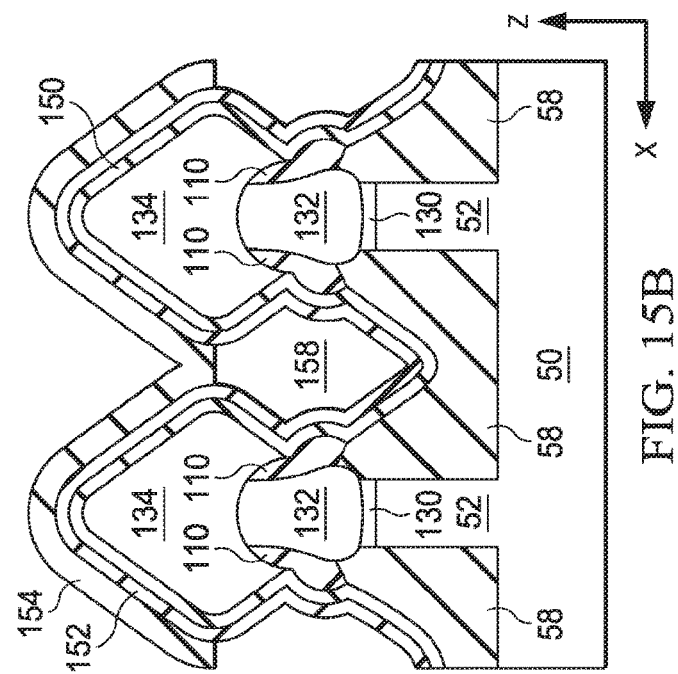
Figure 15A:
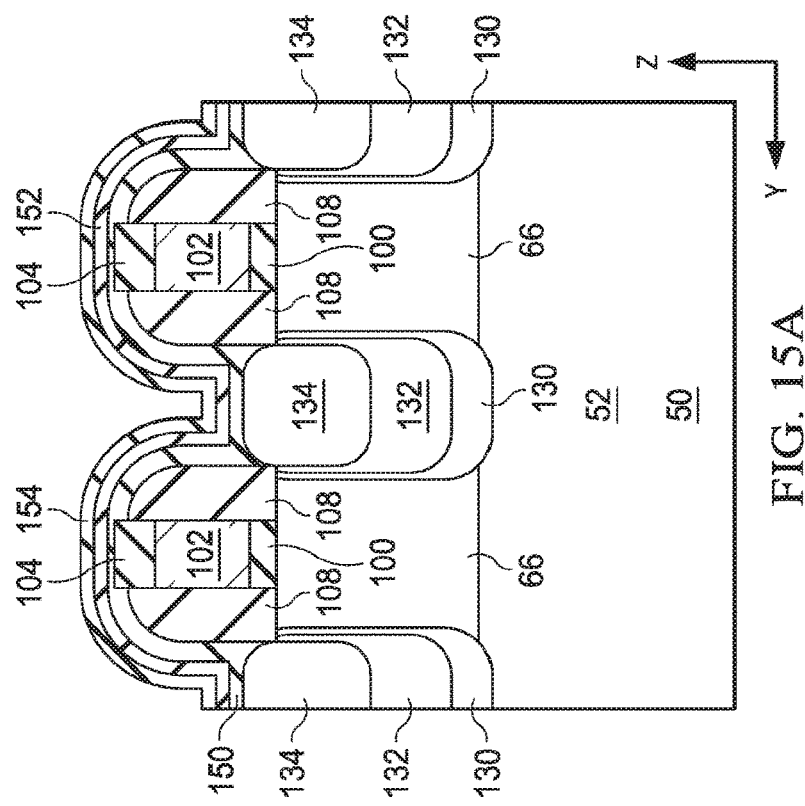

In FIGS. 15A and 15B, a buffer layer 150, such as an oxide layer of silicon oxide, is conformally formed along exposed surfaces of the isolation regions 58, barrier portions 110, third epitaxial regions 134, spacers 108, and masks 104. The buffer layer 150 may be formed by Plasma-Enhanced ALD (PEALD), the like, or a combination thereof. In the illustrated embodiment, the buffer layer 150 has a thickness between approximately 1 nm and approximately 4 nm, such as about 2.5 nm. Any acceptable material may be used as the buffer layer, such as silicon oxide, silicon oxynitride, the like, or a combination thereof. A dual-layer etch stop layer is formed on the buffer layer 150. The dual-layer etch stop layer, in an embodiment, comprises a first sub-layer 152, such as a silicon carbon-nitride (SiCN), and a second sub-layer 154, such as silicon nitride (SiN). Sub-layers 152 and 154 may be any appropriate material, for example, materials such as SiCO, CN, or the like that provide for different etch selectivity from adjacent layers, e.g., the immediately underlying and overlying layers, as discussed below. The first sub-layer 152 is formed conformally on the buffer layer 150 and may be formed by using an ALD process or the like. The second sub-layer 154 is formed on the first sub-layer 152 over upper surfaces of the third epitaxial regions 134. The second sub-layer 154 merges proximate to mid-portions of neighboring ones of the third epitaxial regions 134 to form a void 158 between neighboring fin structures. In some embodiments, the second sub-layer 154 may not be substantially formed along or below under-surfaces of the third epitaxial regions 134 or along the isolation regions 58. The second sub-layer 154 may be formed by using a PECVD process or the like. In the illustrated embodiment, the first sub-layer 152 has a thickness between approximately 2.5 nm and approximately 4.5 nm, such as about 3.5 nm, and the second sub-layer 154 has a thickness between approximately 2.5 nm and approximately 9 nm, such as between approximately 2.5 nm and approximately 6.5 nm, such as about 5.5 nm.

Figure 16B:
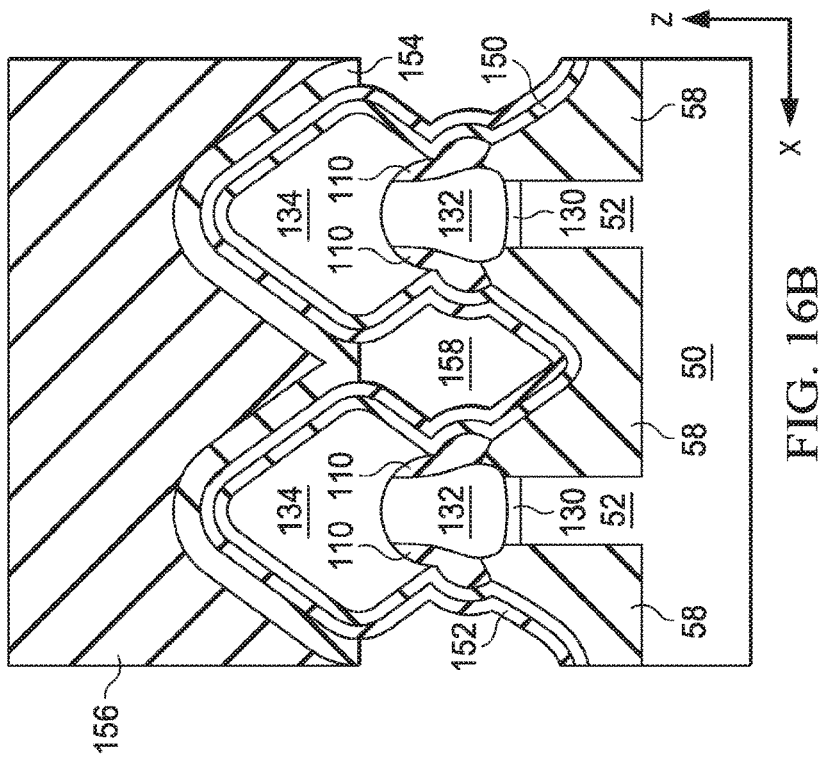
Figure 16A:
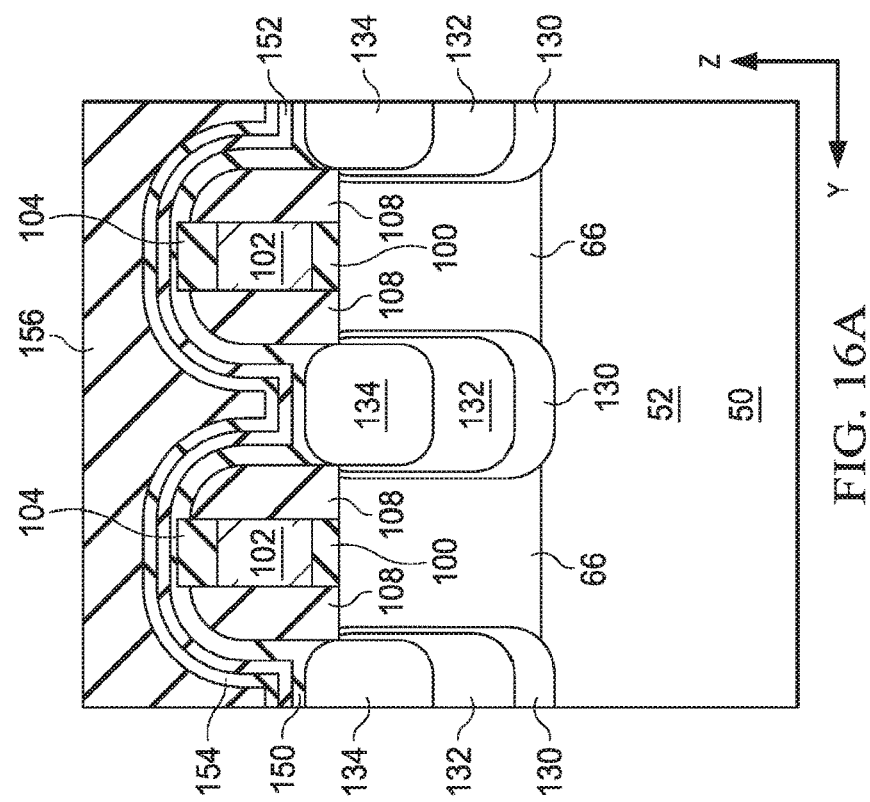

In FIGS. 16A and 16B, a dielectric layer 156, such as an inter-layer dielectric (ILD) layer, is formed over the structure illustrated in FIGS. 15A and 15B, such as over the dual layer etch stop layer. Further in such example, the dielectric layer 156 may be formed of silicon oxide, tetraethyl orthosilicate (TEOS), phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. Since the second sub-layer 154 is merged between neighboring third epitaxial regions 134, the dielectric layer 156 is not significantly deposited in the void 158.

Figure 17B:
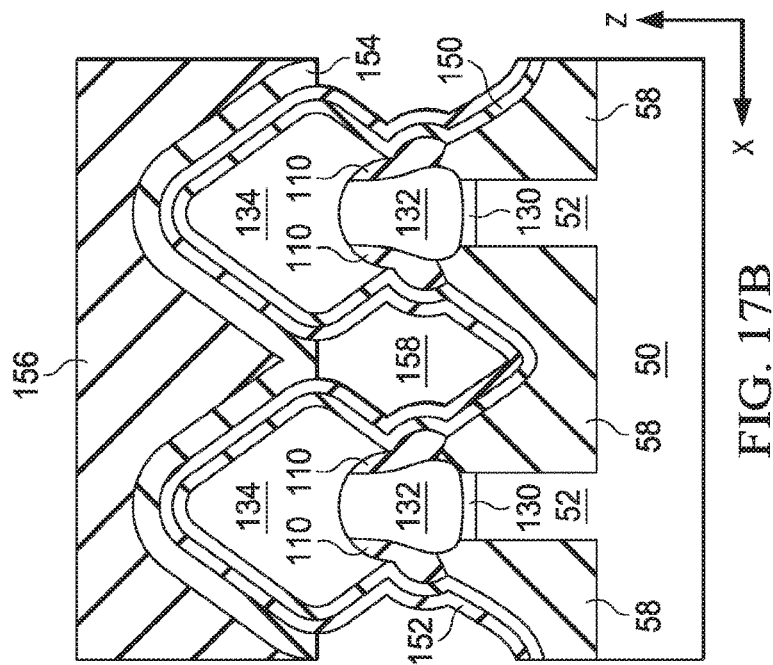
Figure 17A:
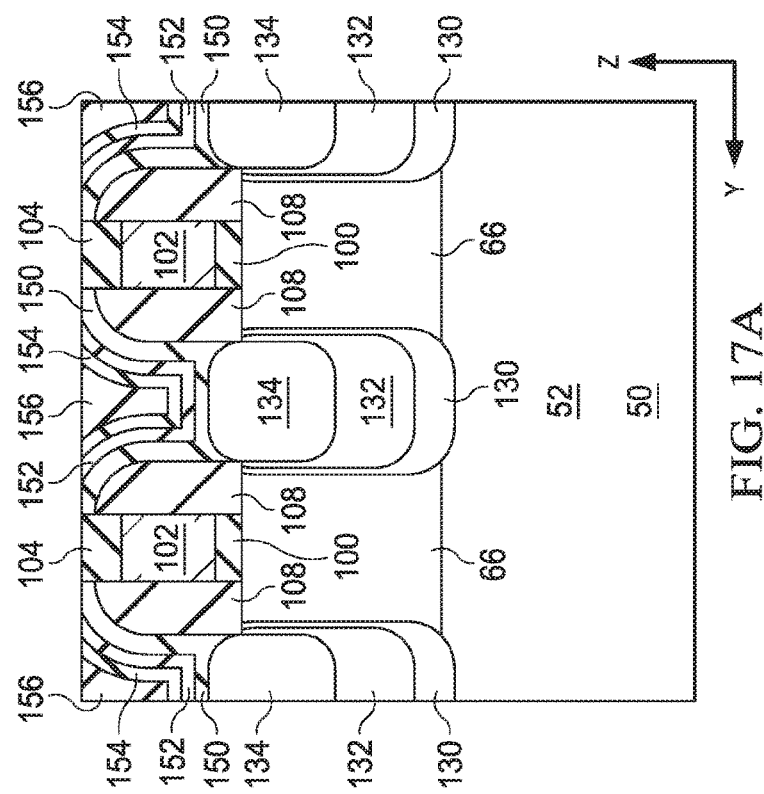

In FIGS. 17A and 17B, the dielectric layer 156 is planarized to expose the masks 104 or dummy gates 102. The planarization may be performed by using a CMP process.

In FIGS. 18A and 18B, masks 104, dummy gates 102, and dummy dielectrics 100 are removed, and a gate dielectric layer 160 and gate electrode material 162 are formed. The masks 104, dummy gates 102, and dummy dielectrics 100 are removed in an etching step(s), so that recesses are formed. Each recess exposes a channel region of a respective epitaxial fin 66. Each channel region is disposed between neighboring sets of a first epitaxial region 130, a second epitaxial region 132, and a third epitaxial region 134. Although not illustrated in this embodiment, channel regions of the epitaxial fin 66 exposed by the recesses may be reshaped, for example, as discussed in FIGS. 29A and 29B through FIGS. 32A and 32B below.

Gate dielectric layer 160 is deposited conformally in the recesses, such as on the top surfaces and the sidewalls of the epitaxial fins 66 and on sidewalls of the gate spacers 108, and on a top surface of the dielectric layer 156. In accordance with some embodiments, gate dielectric layer 160 comprises silicon oxide, silicon nitride, or multilayers thereof. In other embodiments, gate dielectric layer 160 comprises a high-k dielectric material, and in these embodiments, gate dielectric layer 160 may have a k value greater than about 7.0, and may include a metal oxide or a silicate of Hf, Al, Zr, La, Mg, Ba, Ti, Pb, and combinations thereof. The formation methods of gate dielectric layer 160 may include Molecular-Beam Deposition (MBD), ALD, PECVD, and the like. Next, gate electrode material 162 is deposited over the gate dielectric layer 160, and fills the remaining portions of the recesses. Gate electrode material 162 may comprise a metal-containing material such as TiN, TaN, TiC, TaC, Co, Ru, Al, W, TiSiN, TaAlC, TiAlC, a combination thereof, or multi-layers thereof, and may be deposited by PVD, CVD, ALD, the like, or a combination thereof.

In FIGS. 19A and 19B, after the filling of gate electrode material 162, a CMP may be performed to remove the excess portions of gate dielectric layer 160 and the gate electrode material 162, which excess portions are over the top surface of dielectric layer 156, to form gate dielectrics 170 and gate electrodes 172. Then, the gate electrode material 162 is recessed between the spacers 108. The recessing may be by any appropriate etch selective to the gate electrode material 162, and may be, for example, an RIE or the like. The resulting remaining gate electrodes 172 and gate dielectrics 170 thus form replacement gates of the resulting FinFETs. A hardmask material 164 is deposited in the recess and over the remaining structure. The hardmask material 164 may be silicon nitride (SiN), silicon carbon nitride (SiCN), the like, or a combination thereof, and may be deposited by CVD, PECVD, the like, or a combination thereof.

In FIGS. 20A and 20B, a planarization process, such as a CMP, is used to remove excess hardmask material 164 and form hardmasks 173 over the gate electrodes 172 coplanar with a top surface of the dielectric layer 156. A dielectric layer 174, such as an ILD layer, is formed over the planar surface, which may include top surfaces of the dielectric layer 156, the buffer layer 150, first sub-layer 152, second sub-layer 154, spacers 108, gate dielectrics 170 and/or hardmasks 173. Further in such example, the dielectric layer 174 may be formed of silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof.

In FIGS. 21A and 21B, contact recesses 176 are recessed to the third epitaxial regions 134. The contact recesses 176 may be etched through the dielectric layers 174 and 156, the second sub-layer 154, the first sub-layer 152, and the buffer layer 150. The recessing may use any acceptable etching process. For example, the dielectric layers 174 and 156 may be removed using a first dry etching process, and the second sub-layer 154 is removed using a second dry etching process. The first dry etching process and the second dry etching process may be performed in the same chamber by changing appropriate etchants to etch the different materials. Example dry etch processes include RIE, NBE, the like, or a combination thereof. After the second sub-layer 154 is removed, portions of the first sub-layer 152 and the buffer layer 150 are removed, such as by a wet etch. Example wet etches include using phosphoric acid ($H_3PO_4$), the like, or a combination thereof.

As illustrated, portions of the first sub-layer 152 and buffer layer 150 along top surfaces and under-surfaces of the third epitaxial regions 134 are removed. Portions of the first sub-layer 152 and buffer layer 150 along the isolation regions 58 and barrier portions 110 may remain. Portions of the first sub-layer 152 and buffer layer 150 may remain on under-surfaces of the epitaxial regions 134. For example, portions of the first sub-layer 152 and buffer layer 150 may remain on equal to or less than 70% of an under-surface of the third epitaxial regions 134. In the illustration, the surface area represented by distance 188 on the under-surface of the third epitaxial region 134 is equal to or greater than 30% of the surface area, represented by distance 190, of that under-surface of the third epitaxial region 134. In the illustrated embodiment, distance 188 of the under-surface of the third epitaxial regions 134 is greater than 2 nm and is equal to or greater than 30% of distance 190 of the under-surface of the third epitaxial regions 134.

Due to the etching process(es), some loss may occur to the third epitaxial regions 134. In the illustrated embodiment, height loss 180 is equal to or less than approximately 4 nm, and width loss 184 is equal to or less than 1 nm. Further, in the illustrated embodiment, the third epitaxial region 134 remains raised above the epitaxial fin 66 by a distance 182 between approximately 1 nm and approximately 3 nm, such as about 2 nm, and a narrowest spacing 186 of mid-portions of neighboring third epitaxial regions 134 is between approximately 8 nm and approximately 18 nm, such as about 12 nm.

In FIGS. 22A and 22B, a dielectric layer 200, metal layers 202, and a barrier layer 204 are formed over the structure of FIGS. 21A and 21B. The dielectric layer 200 is formed conformally on the structure. The dielectric layer 200 may comprise a metal oxide, such as comprising a metal of the group consisting of Zr, Hf, Ti, Al, Ta, In, Ni, Be, Mg, Ca, Y, Ba, Sr, Sc, Ga, Zn, Sn, and mixtures thereof, such as TiO, $TiO_2$, $Ti_2O_3$, or $Al_2O_3$. In an embodiment, the dielectric layer 200 is deposited by ALD or the like. In another embodiment, the dielectric layer 200 may be formed by depositing a metal layer of, for example, Ti, Al, Zr, Hf, Ta, In, Ni, Be, Mg, Ca, Y, Ba, Sr, Sc, Zn, Sn, or Ga, that may be formed using a method such as CVD, ALD or sputtering, and thereafter, treating the metal layer. The treating the metal layer is first performed by exposing a surface of the metal layer to an oxygen-containing environment, such as air or a sealed chamber, under an oxygen pressure of about $1*10^{-10}$ Torr to about 760 Torr, resulting in a blanket adsorbed oxygen-containing film formed over a surface of the metal layer. In some embodiments, the oxygen-containing environment comprises $H_2O$, $O_2$, or $O_3$. After exposing the surface of the metal layer to the oxygen-containing environment, the step of treating the metal layer further comprises exposing the surface of the metal layer to an inert gas, at a temperature of about 200° C. to about 800° C. In some embodiments, the inert gas comprises $N_2$, He, or Ar. In the depicted embodiment, the blanket adsorbed oxygen-containing film reacts with the metal layer in contact therewith to form the dielectric layer 200.

The metal layer 202 is deposited over the dielectric layer 200. In some embodiments, the metal layer 202 comprises Ta, Ti, Hf, Zr, Ni, W, Co, Cu, Al, the like, or a combination thereof. In some embodiments, the metal layer 202 may be formed by radio frequency PVD (RF-PVD), CVD, PVD, plating, ALD, or other suitable technique. As illustrated the metal layer 202 is formed on upper surfaces of the third epitaxial regions 134 and are not formed on under-surfaces of the third epitaxial regions 134. In other embodiments, the metal layer 202 may be conformally formed on the structure, such as on under-surfaces of the third epitaxial regions 134 and along the isolation regions 58. The metal layer 202 may be conformally formed using, for example, a CVD process. Further, in some embodiments, the metal layer 202 may merge together.

The barrier layer 204 may comprise a metal nitride, such as a nitride of Ti, Ta, or the like, and may be deposited by CVD or the like. The barrier layer 204 is formed conformally on the structure.

In the illustrated embodiment, the dielectric layer 200 is $TiO_2$ deposited by ALD; the metal layers 202 are Ti deposited by RF-PVD; and the barrier layer 204 is TiN deposited by CVD. In the illustrated embodiment, the dielectric layer 200 has a thickness 206 between approximately 0.5 nm and approximately 8 nm, such as about 1 nm; the metal layers 202 have a thickness 208 between approximately 2 nm and approximately 12 nm, such as about 4 nm; and the barrier layer 204 has a thickness 210 between approximately 1 nm and approximately 4 nm, such as about 2 nm.

In some embodiments, a pre-metal deposition cleaning step may be performed before depositing the dielectric layer 200. For example, the cleaning step may use a dHF solution (e.g., a $H_2O$:HF mixture of 500:1) for 75 seconds. In the illustrated embodiment, when such a dHF solution is used, some loss of the third epitaxial regions 134 may occur, such as 1 nm from a width (e.g., X-direction) and a height (e.g., Z-direction).

Figure 23A:
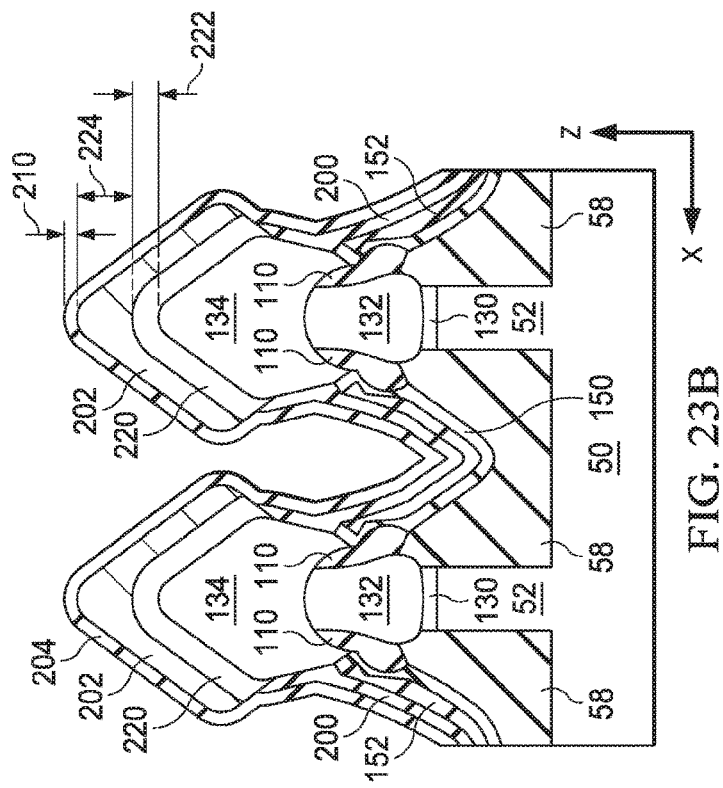
Figure 23B:
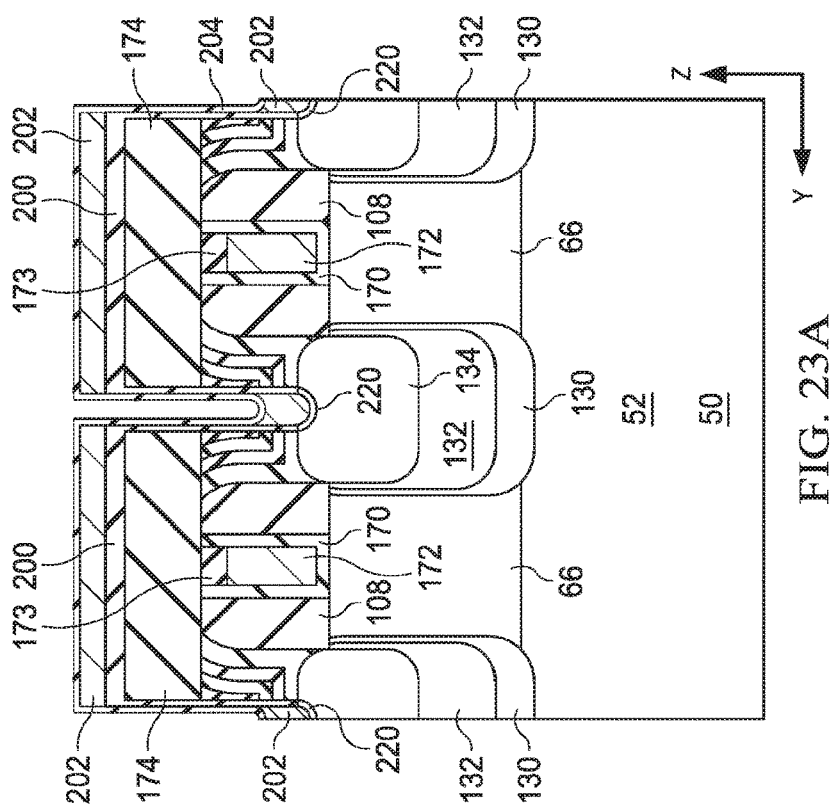

In FIGS. 23A and 23B, an annealing step is performed. For example, the anneal may be a rapid thermal anneal at a temperature between approximately 200° C. and approximately 850° C., such as about 600° C., at a duration between approximately 1 microsecond (µs) and approximately 2 seconds (s), such as about 1 s. The anneal forms a metal-semiconductor compound layer 220, such as a silicide, on upper surfaces of the third epitaxial regions 134. In embodiments where the metal layer 202 is formed conformally on the under-surfaces of the third epitaxial regions 134, the metal-semiconductor compound layer 220 may also be formed on under-surfaces of the third epitaxial regions 134. In the illustrated embodiment, the anneal causes the $TiO_2$ of the dielectric layer 200 to decompose, and TiSiGe metal-semiconductor compound layers 220 are formed on upper surfaces of the third epitaxial regions 134. In the illustrated embodiment, the metal-semiconductor compound layers 220 have a thickness of between approximately 2 nm and approximately 8 nm, such as about 3 nm, and remaining thicknesses 224 of the metal layers 202 are between approximately 3 nm and approximately 9 nm, such as about 7 nm.

Figure 24B:
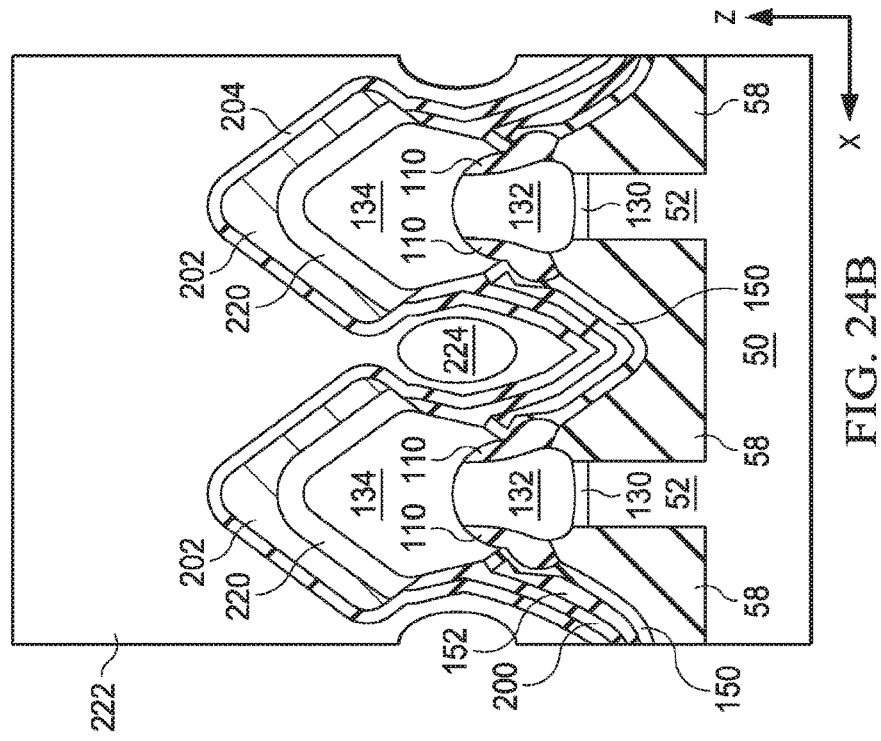
Figure 24A:
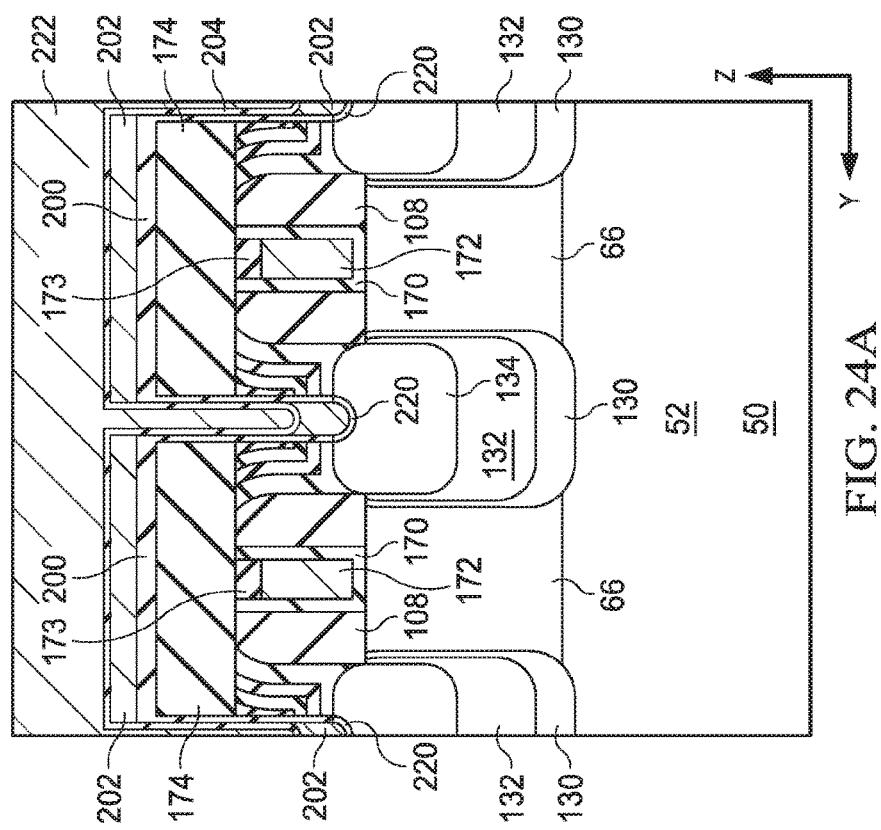

In FIGS. 24A and 24B, a conductive material 222, such as a metal, is deposited in the contact recesses 176. The conductive material 222 may be W, Al, Cu, the like, or a combination thereof. The deposition may be by CVD, PVD, electro-chemical plating (ECP), the like, or a combination thereof. As illustrated, a void 224 may be formed between neighboring fins due to the configuration of the various dimensions.

Figure 25B:
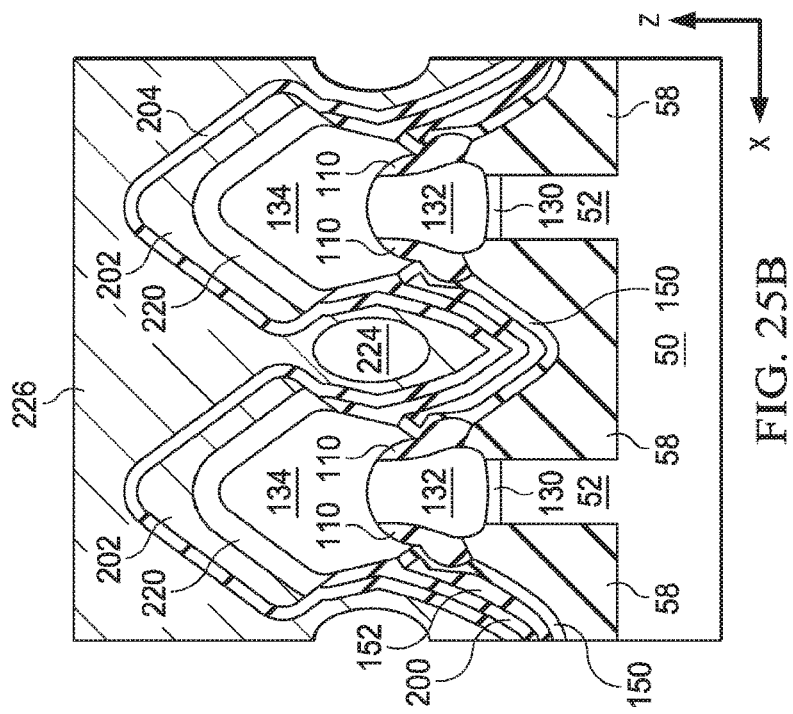
Figure 25A:
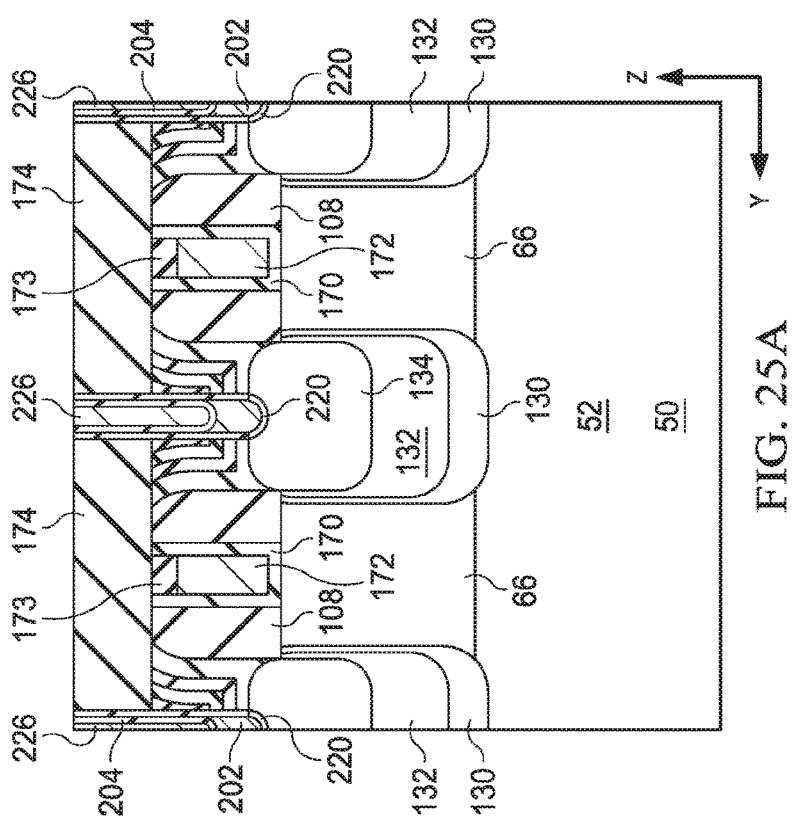

In FIGS. 25A and 25B, excess conductive material 222, barrier layer 204, metal layers 202, and dielectric layer 200 are removed from a top surface of the dielectric layer 174.

This removal may be by using a planarization process, such as a CMP. Remaining conductive material 226, barrier layer 204, metal layers 202, dielectric layer 200, and metal-semiconductor compound layer 220 in the contact recesses 176 form contacts to respective source/drain regions (e.g., the third epitaxial regions 134) of the fins.

Following the processing in FIGS. 25A and 25B, the structure may undergo various processing. For example, contacts may be formed to the gate electrodes 172 through the dielectric layer 174 and the hardmasks 173. Further, an etch stop layer may be deposited, and an inter-metallic dielectric (IMD) layer may be deposited over the etch stop layer. The etch stop layer may include SiO, SiC, SiN, SiOC, SiON, SiCN, TiN, AlN, AlON, TEOS, hard black diamond (HBD), or the like, and may be formed using a suitable process such as ALD, CVD, PVD, spin-on, or combinations thereof. The IMD layer may comprise a low-K dielectric material, such as silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A metallization pattern, with or without a barrier layer, may be formed in and/or through the IMD. Further IMD layers, which may include metallization patterns, and any corresponding etch stop layers, may be formed thereover. A person of ordinary skill in the art will understand additional processing that structures in the figures may undergo, and hence, explicit discussion is omitted herein for brevity.

The structure in FIGS. 25A and 25B may be a finFET. One or more of the first epitaxial region 130, second epitaxial region 132, and third epitaxial region 134 may form all or a portion of a source/drain region. In other embodiments, the source/drain region may be a single epitaxial region, a bi-layer epitaxial region, or other. A channel region may be defined in the epitaxial fin 66 under the gate structure and between source/drain regions.

FIGS. 26A and 26B through FIGS. 28A and 28B illustrate steps of a second example method of forming a FinFET. Processing of a structure is carried out as discussed above with respect to FIG. 1 through FIGS. 20A and 20B. In FIGS. 26A and 26B, contact recesses 176 are recessed to the third epitaxial regions 134. The contact recesses 176 may be etched through the dielectric layers 174 and 156, the second sub-layer 154, the first sub-layer 152, and the buffer layer 150. In the illustrated embodiment, the second sub-layer 154 is etched using a dry etching process, and portions of the first sub-layer 152 and the buffer layer 150 are etched using a wet etch process, such as a wet phosphoric acid ($H_3PO_4$) etch, or the like. As illustrated, the second sub-layer 154 is wholly removed, and the first sub-layer 152 and buffer layer 150 along top surfaces and under-surfaces of the third epitaxial regions 134 are removed. Portions of the first sub-layer 152 and buffer layer 150 along the isolation regions 58 may remain, such as in lowest regions of the isolation regions 58. In this illustrated embodiment, the second sub-layer 154 and the first sub-layer 152 are wholly removed from surfaces of the third epitaxial regions 134.

Due to the etching process(es), some loss may occur to the third epitaxial region 134. In the illustrated embodiment, height loss 180 is equal to or less than approximately 1 nm, and width loss 184 is equal to or less than 1 nm. Further, in the illustrated embodiment, the third epitaxial region 134 remains raised above the epitaxial fin 66 by a distance 182 of at least approximately 1 nm, and a narrowest spacing 186 of mid-portions of neighboring third epitaxial regions 134 is between approximately 8 nm and approximately 16 nm, such as about 12 nm.

Processing then continues through FIGS. 27A, 27B, 28A, and 28B as discussed in FIGS. 22A, 22B, 23A, and 23B. As shown in FIGS. 27A, 27B, 28A, and 28B, the dielectric layer 200 may be formed directly on the barrier portions 110 and portions of the isolation regions 58. Processing continues as discussed above with respect to FIGS. 24A, 24B, 25A, and 25B.

Figure 29B:
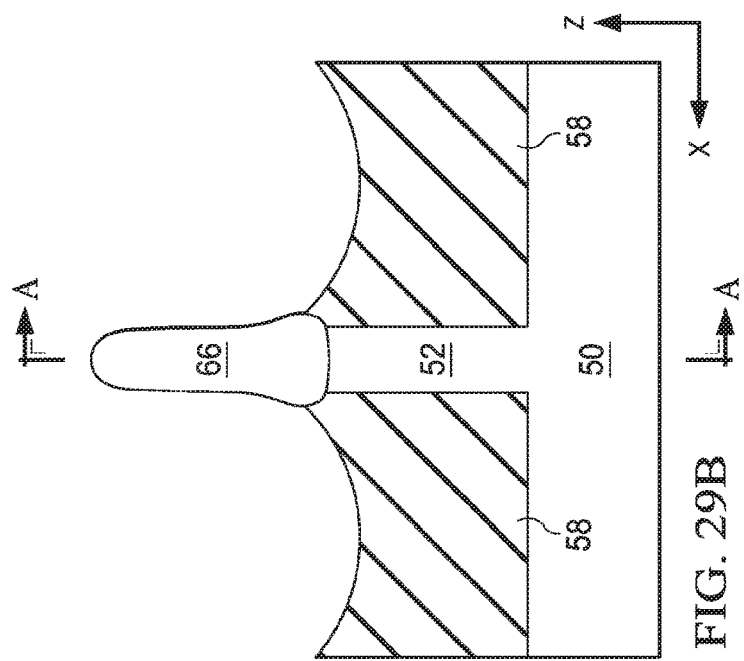
Figure 29A:
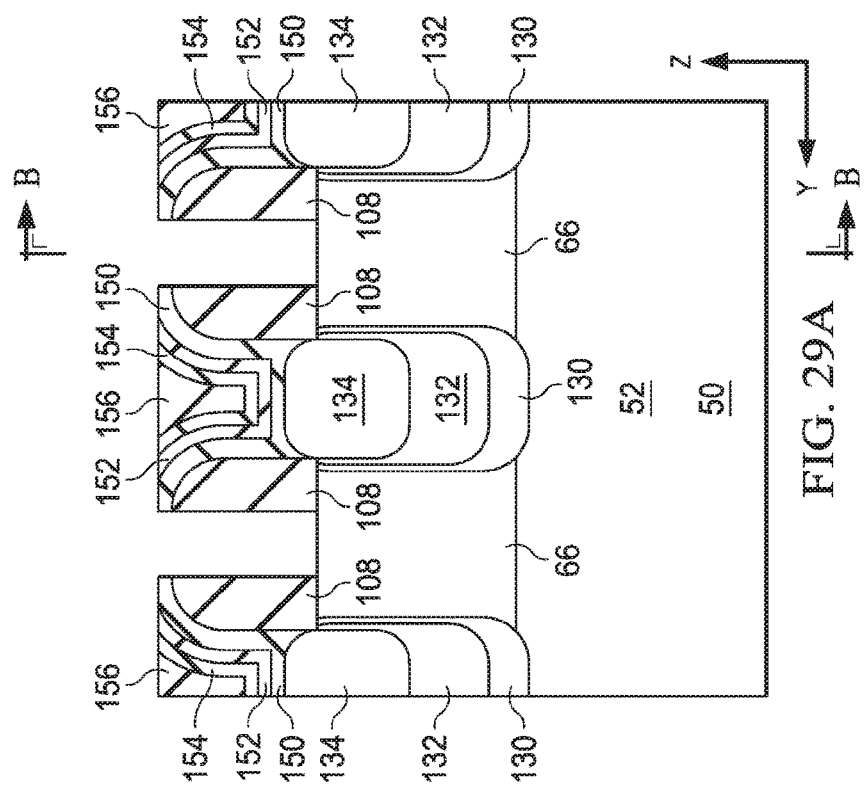

FIGS. 29A and 29B through FIGS. 32A and 32B illustrate further reshaping of a channel region of the epitaxial fin 66 that may occur during a gate replacement process. As discussed with respect to FIGS. 18A and 18B, masks 104, dummy gates 102, and dummy dielectrics 100 are removed. After removal, reshaping of the channel region may be performed. FIGS. 29A and 29B illustrate the structure of FIGS. 17A and 17B after masks 104, dummy gates 102, and dummy dielectrics 100 have been removed. FIG. 29A illustrates an example cross section B-B of a channel region that corresponds to the cross section used in following figures ending in "B." Similarly, FIG. 29B illustrates an example cross section A-A that corresponds to the cross section used in following figures ending in "A."

Figure 30B:
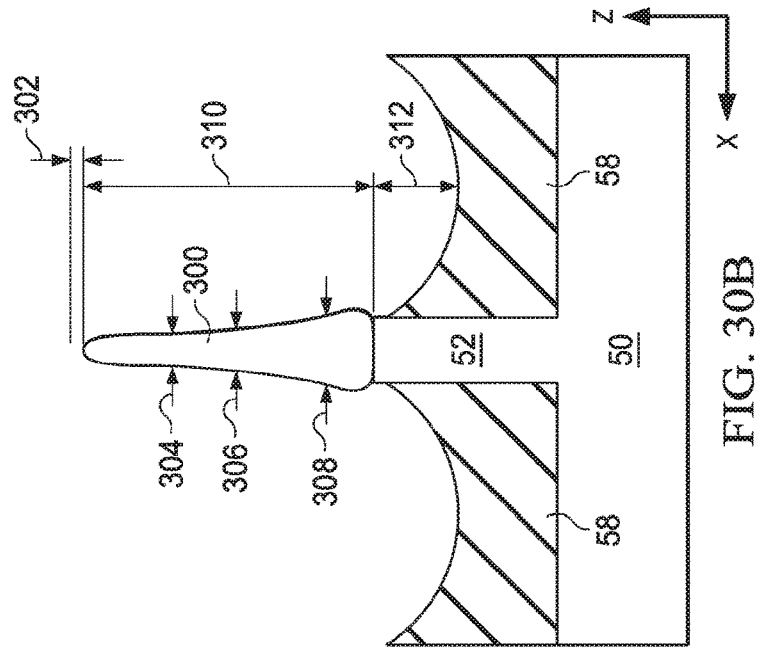
Figure 30A:
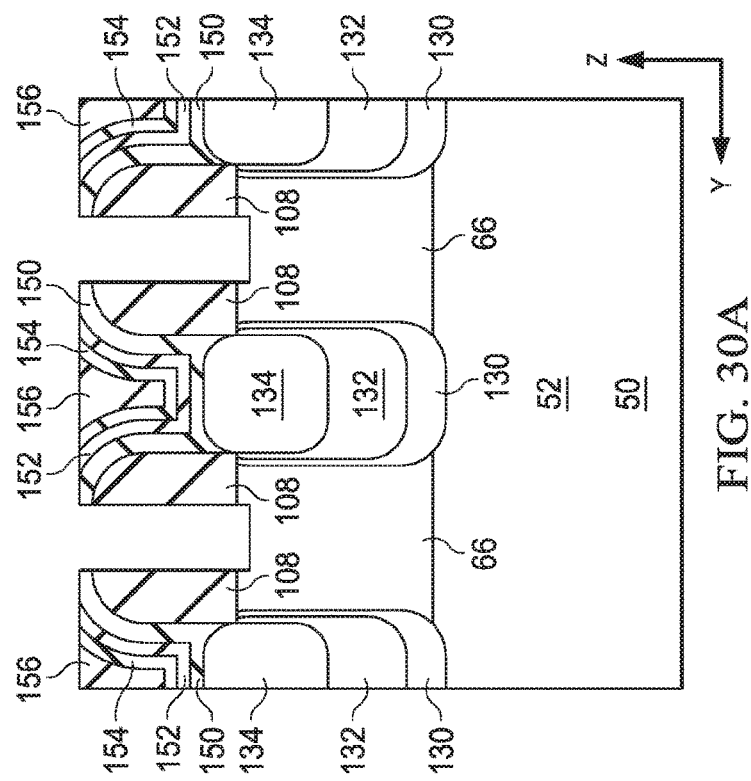

In FIGS. 30A and 30B, the channel regions of the epitaxial fin 66 are reshaped. In an embodiment, the epitaxial fins 66 are reshaped using an etching process, such as using TBE, $NH_4OH$, HCl, CERTAS®, the like, or a combination thereof, to form reshaped fins 300. In the illustrated embodiment, with using an etching process, the epitaxial fin 66 height loss 302 is 3 nm, and the epitaxial fin height 310 is between approximately 32 nm and approximately 34 nm, such as about 33 nm. Further, in the illustrated embodiment, the width 304 at a depth of 5 nm from a top of the reshaped fin 300 is between approximately 3.6 nm and approximately 4.4 nm, such as about 4 nm; the width 306 at a depth of 15 nm is between approximately 5.4 nm and approximately 6.6 nm, such as about 6 nm; and the width 308 at a depth of 30 nm is between approximately 9 nm and approximately 11 nm, such as about 10 nm. The reshaping process may also cause some loss and/or additional dishing to exposed portions of the isolation regions 58. In the illustrated embodiment, the dishing depth 312 is between approximately 9 nm and approximately 11 nm, such as about 10 nm.

In FIGS. 31A and 31B, an epitaxial regrowth region 320 is epitaxially grown on the reshaped channel regions of the reshaped fins 300. The epitaxial regrowth region 320 may be epitaxially grown using MOCVD, MBE, LPE, VPE, SEG, the like, or a combination thereof. The epitaxial regrowth region 320 can comprise or consist essentially of any appropriate material, such as silicon, silicon germanium, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like. In the illustrated embodiment, the epitaxial regrowth region 320 is silicon with a thickness of 0.7 nm. Further, in the illustrated embodiment, the width 324 of the reshaped fin 300 and epitaxial regrowth region 320 at a depth of 5 nm from a top of the epitaxial regrowth region 320 is between approximately 4.9 and approximately 5.9, such as about 5.4; the width 326 at a depth of 15 nm is between approximately 6.7 and approximately 8.1, such as about 7.4; and the width 328 at a depth of 30 nm is between approximately 10.4 and approximately 12.4, such as about 11.4.

Figure 32B:
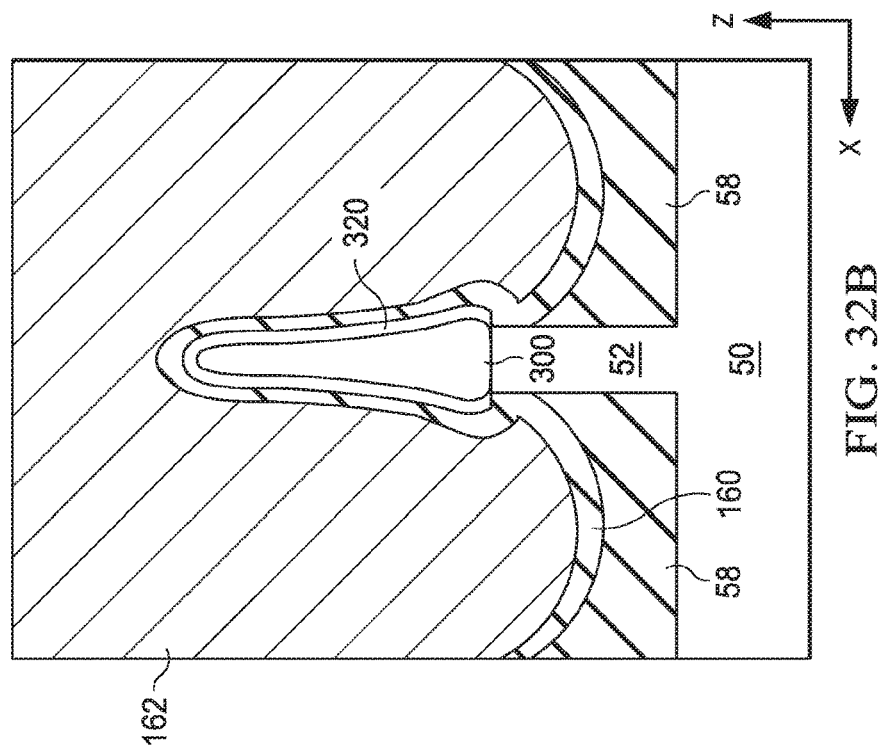
Figure 32A:
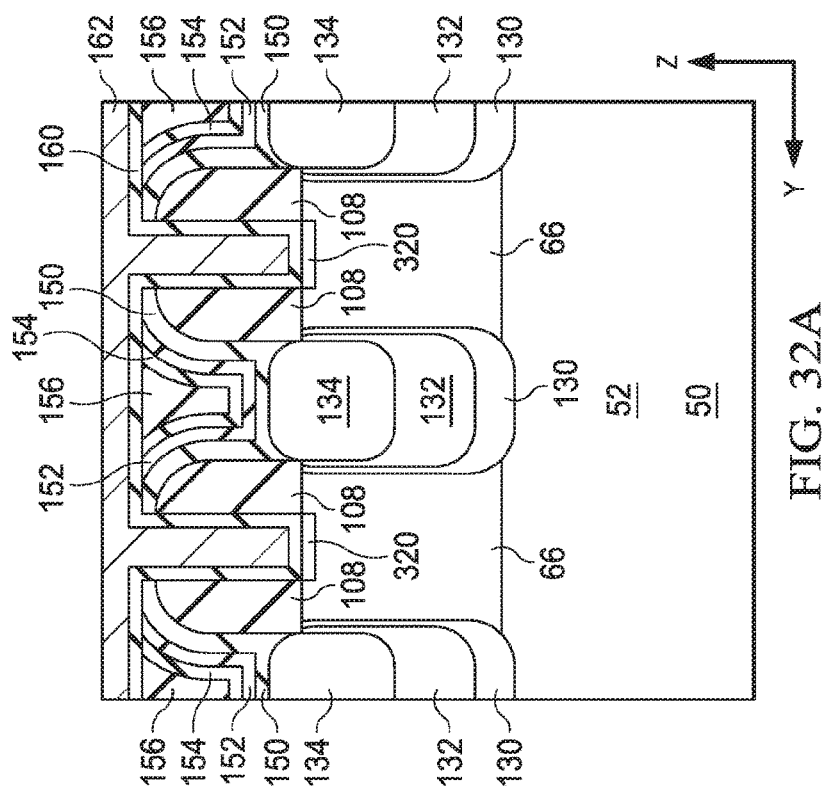

A pre-epitaxy cleaning step may cause loss of some of the exposed isolation regions 58. This may expose a portion of fin 52, if present. In the illustrated embodiment, the height 330 of the reshaped fin 300 and epitaxial regrowth region 320 is between approximately 32.7 nm and approximately 34.7 nm, such as 33.7 nm; the dishing depth 334 is between approximately 12 nm and approximately 14 nm, such as about 13 nm; and a fin structure (e.g., including the epitaxial regrowth region 320, reshaped fin 300, and any exposed fin 52) height 332 is between approximately 35.7 and approximately 37.7, such as about 36.7. In FIGS. 32A and 32B, the gate dielectric layer 160 and the gate electrode material 162 are formed, as discussed with respect to FIGS. 18A and 18B.

Although the various illustrated embodiments are discussed above with respect to a p-doped source/drain region of a finFET, aspects may also be applied to an n-doped source/drain region of a finFET. For example, the third epitaxial regions 134 may be silicon doped with phosphorus, arsenic, or the like. In other embodiments, structures may include multiple finFETs where some are n-type finFETs and others are p-type finFETs, such as complementary technology. A person of ordinary skill in the art will readily understand how to implement these embodiments in view of the foregoing discussion, so explicit discussion herein is omitted.

Embodiments may achieve advantages. For example, by forming a dual-layer etch stop that merges to form voids as discussed above, material along under-surfaces of the third epitaxial regions 134 may be more easily removed since some material may be prevented from being deposited on those under-surfaces due to the presence of the merged dual-layer etch stop. This may allow for additional exposure of the under-surfaces prior to forming the dielectric layer 200 and barrier layer 204. With the dielectric layer 200 and barrier layer 204 being formed on the under-surfaces of the third epitaxial regions 134, a metal-insulator-semiconductor (MIS) contact can be formed on the under-surfaces. Additionally, loss of the third epitaxial regions 134 may be reduced by the used of the dual-layer etch stop. The MIS contact in conjunction with an added contact area to the third epitaxial regions 134 (e.g., by way of the under-surfaces and/or avoided loss) may allow for a decreased contact resistance to a source/drain region of a FinFET. The added contact area may be a 60% increase over contact areas previously used.

An embodiment is a structure including fin structure on a substrate. The fin structure includes an epitaxial region. The epitaxial region has an upper surface and an under-surface. A contact structure is on the epitaxial region. The contact structure includes an upper contact portion and a lower contact portion. The upper contact portion includes a metal layer over the upper surface and a barrier layer over the metal layer. The lower contact portion includes a metal-insulator-semiconductor (MIS) contact along the under-surface. The MIS contact includes a dielectric layer on the under-surface and the barrier layer on the dielectric layer.

Another embodiment is a semiconductor device including a fin formed over a substrate. A gate structure is formed over the fin, the gate structure including a gate dielectric and a gate electrode. A source/drain structure is formed over the fin and adjacent the gate structure. A dielectric layer is disposed on an underside of the source/drain structure. A metal-semiconductor compound layer is disposed on a top surface of the source/drain structure. A metal layer is disposed on the metal-semiconductor compound layer. A conformal barrier layer is disposed on the metal layer and the dielectric layer.

An embodiment includes a semiconductor device including a first fin extending from a substrate and a second fin extending from the substrate. The second fin is adjacent to the first fin. A first epitaxial region is disposed on the first fin and a second epitaxial region is disposed on the second fin. The first epitaxial region is adjacent the second epitaxial region. A metal layer is disposed on a top surface of the first epitaxial region and on a top surface of the second epitaxial region. A conformal dielectric layer is disposed on an under surface of the first epitaxial region and on an under surface of the second epitaxial region. A conformal barrier layer is disposed on and extending continuously over the top surface of the first epitaxial region, the under surface of the first epitaxial region, the top surface of the second epitaxial region, and the under surface of the second epitaxial region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a neighboring pair of fin structures on a substrate, the fin structures each comprising an epitaxial region extending above an isolation region disposed between the fin structures;
   conformally forming a first etch stop layer over the fin structures and the isolation region;
   forming a second etch stop layer on the first etch stop layer and on upper surfaces of the epitaxial regions, the second etch stop layer merging between the fin structures, the merging of the second etch stop layer forming an enclosed void between the fin structures;
   removing a portion of the first etch stop layer from under-surfaces of the epitaxial regions; and
   forming first contacts on portions of the upper surfaces of the epitaxial regions and second contacts on portions of the under-surfaces of the epitaxial regions, wherein the first contacts are a first type of contact and the second contacts are a second type of contact different from the first type of contact.

2. The method of claim 1, wherein forming the first contacts comprises forming a metal-semiconductor compound layer on the upper surfaces of the epitaxial regions and forming a first metal layer over the metal-semiconductor compound layer, wherein a portion of the under-surfaces of the epitaxial regions is free of the metal-semiconductor compound layer.

3. The method of claim 1, wherein forming the second contacts comprises forming a dielectric layer on the under-surfaces of the epitaxial regions, wherein a portion of the upper surfaces of the epitaxial regions is free of the dielectric layer.

4. The method of claim 1, wherein forming the first contacts and forming the second contacts comprises forming a barrier layer over the under-surfaces of the epitaxial regions and over the upper surfaces of the epitaxial regions.

5. The method of claim 1, wherein forming the first contacts and forming the second contacts comprises forming a second metal layer over the under-surfaces of the epitaxial regions and over the upper surfaces of the epitaxial regions.

6. The method of claim 1, further comprising removing a portion of the second etch stop layer from the upper surfaces of the epitaxial regions.

7. A method comprising:
forming a semiconductor fin over a substrate;
forming a gate structure over the semiconductor fin;
forming an epitaxial region over the semiconductor fin and adjacent the gate structure, wherein the epitaxial region comprises an upper surface and a lower surface, wherein the upper surface is farther from the substrate than the lower surface;
forming a first contact structure on the lower surface of the epitaxial region, comprising:
 forming a dielectric layer over and physically contacting the lower surface; and
 forming a first portion of a first metal layer over the dielectric layer; and
forming a second contact structure on the upper surface of the epitaxial region, comprising:
 forming a metal-semiconductor compound layer over and physically contacting the upper surface;
 forming a second metal layer over the metal-semiconductor compound layer; and
 forming a second portion of the first metal layer over the second metal layer.

8. The method of claim 7, further comprising:
conformally forming a first etch stop layer over the epitaxial region, wherein a first portion of the first etch stop layer extends over the upper surface and a second portion of the first etch stop layer extends over the lower surface; and
forming a second etch stop layer over the first portion of the first etch stop layer, wherein the second portion of the first etch stop layer is free of the second etch stop layer.

9. The method of claim 8, wherein the epitaxial region is a first epitaxial region of a plurality of epitaxial regions, and wherein the second etch stop layer extends from over the first epitaxial region to over a second epitaxial region that is adjacent the first epitaxial region.

10. The method of claim 9, wherein forming the second etch stop layer forms an enclosed void disposed between the first epitaxial region and the second epitaxial region.

11. The method of claim 7, further comprising forming a barrier layer extending over the dielectric layer and over the second metal layer, wherein the first metal layer is disposed over the barrier layer.

12. The method of claim 7, wherein the metal-semiconductor compound layer comprises a silicide.

13. A method comprising:
forming a first fin structure comprising a fin extending from a substrate and an epitaxial region over the fin;
forming a conformal dielectric layer over the epitaxial region, a first portion of the dielectric layer extending above an upper surface of the epitaxial region and a second portion of the dielectric layer extending under an under-surface of the epitaxial region;
selectively forming a first metal layer above the first portion of the dielectric layer without forming the first metal layer under the second portion of the dielectric layer;
performing an annealing process on the first portion of the dielectric layer, the first metal layer, and the epitaxial region to convert the first portion of the dielectric layer into a metal-semiconductor compound layer; and
forming a conformal barrier layer extending over the first metal layer and the second portion of the dielectric layer.

14. The method of claim 13, further comprising:
forming a second fin structure adjacent the first fin structure and separated from the first fin structure by an isolation region;
forming a first etch stop layer extending continuously over the first fin structure, over the isolation region, and over the second fin structure; and
forming a second etch stop layer extending from a top surface of the first fin structure to a top surface of the second fin structure, the second etch stop layer extending above the isolation region, wherein a void extends from the first etch stop layer over the isolation region to the second etch stop layer above the isolation region.

15. The method of claim 14, further comprising removing a portion of the first etch stop layer over the first fin structure.

16. The method of claim 13, further comprising forming a conductive material over the conformal barrier layer.

17. The method of claim 13, wherein the conformal barrier layer, the second portion of the dielectric layer, and the under-surface of the epitaxial region form a metal-insulator-semiconductor contact.

18. The method of claim 13, wherein the dielectric layer comprises a metal oxide.

19. The method of claim 13, wherein the metal-semiconductor compound layer comprises TiSiGe.

20. The method of claim 13, wherein the conformal barrier layer comprises $TiO_2$.

* * * * *